(12) United States Patent
Woo

(10) Patent No.: US 11,037,490 B2
(45) Date of Patent: Jun. 15, 2021

(54) ORGANIC LIGHT EMITTING DISPLAY DEVICE

(71) Applicant: LG Display Co., Ltd., Seoul (KR)

(72) Inventor: Joungwon Woo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/690,912

(22) Filed: Nov. 21, 2019

(65) Prior Publication Data

US 2020/0184885 A1   Jun. 11, 2020

(30) Foreign Application Priority Data

Dec. 7, 2018   (KR) .......................... 10-2018-0157042

(51) Int. Cl.
G09G 3/3225 (2016.01)
(52) U.S. Cl.
CPC ... G09G 3/3225 (2013.01); *G09G 2300/0452* (2013.01)
(58) Field of Classification Search
None
See application file for complete search history.

(56) References Cited

U.S. PATENT DOCUMENTS

| 2015/0270317 A1* | 9/2015 | Lee | H01L 27/3218 257/40 |
| 2016/0087248 A1* | 3/2016 | Paek | H01L 27/3206 438/35 |
| 2016/0155786 A1* | 6/2016 | Park | H01L 27/322 257/40 |

* cited by examiner

*Primary Examiner* — Matthew Yeung
(74) *Attorney, Agent, or Firm* — Fenwick & West LLP

(57) ABSTRACT

The present disclosure provided an organic light emitting display device comprising: first sub-pixels and second sub-pixels alternately arranged on a substrate in a first direction and a second direction orthogonal to each other; third sub-pixels arranged in a third direction at tilted angles with the first direction and the second direction with respect to the first sub-pixels and the second sub-pixels; first electrodes of an organic light-emitting diodes respectively allocated to each of the first to third sub-pixels; a first bank having first openings for exposing the first electrodes on the first electrodes; and a second bank having second openings for exposing the first electrodes on the first bank, wherein the second openings respectively expose the first to third electrodes and each of the second openings which exposes the third electrodes simultaneously exposes the first electrodes of at least two of the third sub-pixels.

14 Claims, 19 Drawing Sheets

ORGANIC LIGHT EMITTING DISPLAY DEVICE

CROSS-REFERENCE TO RELATED APPLICATIONS

This application claims the priority benefit of Republic of Korea Patent Application No. 10-2018-0157042 filed on Dec. 7, 2018, which is incorporated by reference in its entirety.

BACKGROUND

Field of Technology

The present disclosure relates to an organic light emitting display device.

Related Art

Recently, various display devices which are light and compact and thus can supplement the weakness of cathode ray tubes have been developed. Such display devices include a liquid crystal display (LCD), a plasma display panel (PDP), a field emission display (FED), an organic light emitting display device, etc.

Light emitting display devices are spontaneous emission devices and have the advantages of a high response speed, high emission efficiency, high luminance and a wide viewing angle. Further, flexible display devices can be realized because elements can be formed on a flexible substrate such as a plastic substrate.

As large-area high-definition organic light emitting display devices are required, a single panel includes a plurality of sub-pixels. A mask is used for patterning of red, green and blue sub-pixels, in general. Accordingly, to realize large-area display devices, a large-area fine metal mask (FMM) corresponding thereto is needed. However, a mask is bent as the area thereof increases to causes various problems such as deposition of an organic light-emitting material forming an emission layer at an incorrect position.

To solve problems in a deposition method using the aforementioned mask, a solution process which is simple and suitable for large areas attracts interest. The solution process can perform large-area patterning through inkjet printing or nozzle printing without a mask and has a very high material use rate of about 50 to 80% compared to evaporation having a material use rate of less than 10%. In addition, the solution process has a higher glass transition temperature than evaporation and thus can provide high thermal stability and morphology property.

However, when an emission layer is formed through the solution process, a thickness deviation in sub-pixels causes thickness non-uniformity to considerably deteriorate display quality.

Furthermore, in the case of a stripe type sub-pixel structure in which sub-pixels of the same color are alternately arranged in units of column, an aperture ratio may be considerably decreased due to a bank (or a pixel definition film) disposed between sub-pixels and high-definition display capability may be deteriorated.

SUMMARY

An object of the present disclosure is to provide an organic light emitting display device to which a new bank structure is applied in a pentile sub-pixel structure.

An organic light emitting display device according to the present disclosure includes first sub-pixels, second sub-pixels, first electrodes, third sub-pixels, a first bank and a second bank. The first sub-pixels and the second sub-pixels are alternately arranged on a substrate in a first direction and a second direction intersecting each other. The third sub-pixels are arranged in a third direction at tilted angles with the first direction and the second direction with respect to the first sub-pixels and the second sub-pixels. The first electrodes are allocated to the first to third sub-pixels. The first bank has first openings for exposing the first electrodes on the first electrodes. The second bank has second openings for exposing the first electrodes on the first bank. The second openings respectively expose the first electrodes of the first and second sub-pixels and simultaneously expose the first electrodes of the third sub-pixels.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Hereinafter, the present disclosure will be described in detail through different embodiments with reference to the accompanying drawings. The same reference numbers will be used throughout this specification to refer to the same or like parts. In the following description of the present disclosure, a detailed description of known functions and configurations incorporated herein will be omitted when it may obscure the subject matter of the present disclosure. In description of various embodiments, the same components may be representatively described at the beginning and omitted in other embodiments.

In the following description of the embodiments, "first" and "second" are used to describe various components, but such components are not limited by these terms. The terms are used to discriminate one component from another component.

Figure 1:
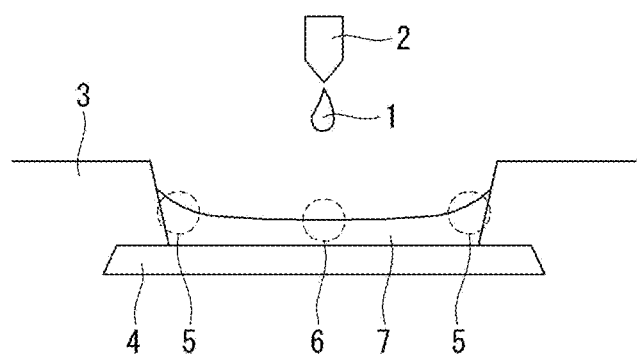
FIG. 1 is a diagram for describing problems of a solution process.

FIG. 1 is a diagram for describing problems of a solution process.

Referring to FIG. 1, when an organic emission layer is formed using the solution process, pile up may occur to deteriorate the emission characteristic of an organic light emitting display device. More specifically, an organic light-emitting material 1 is dropped on a first electrode 4 defined by a bank 3 through an inkjet apparatus 2. The dropped organic light-emitting material 1 has a thickness deviation based on location due to a hardening rate differences in the hardening process. That is, an organic emission layer 7 having a thick edge 5 in contact with the bank and a thin center 6 is formed where the thin center 6 is thinner than the thick edge 5.

When the organic emission layer 7 having a non-uniform thickness is formed in this manner, a luminance deviation based on location may occur to deteriorate display quality. Furthermore, a current density difference may be generated in the organic emission layer 7 to cause a decrease in the lifespan of elements or dark spots may be generated to decrease process yield. In view of this, it is necessary to minimize an area in which pile up occurs in formation of an emission layer using the solution process.

First Embodiment

Figure 2:
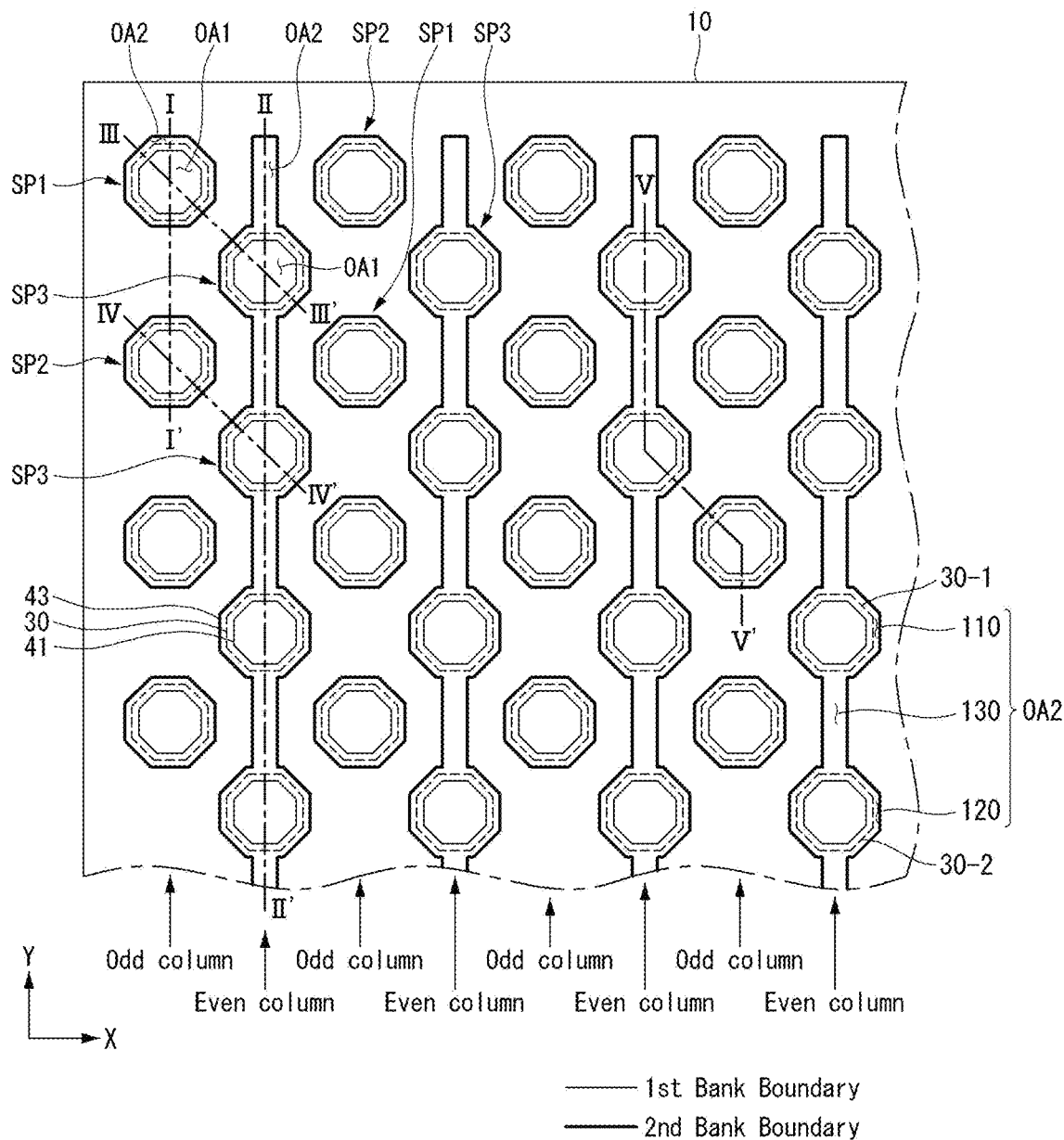
FIG. 2 is a schematic plan view showing an organic light emitting display device according to a first embodiment of the present disclosure.
Figure 3:
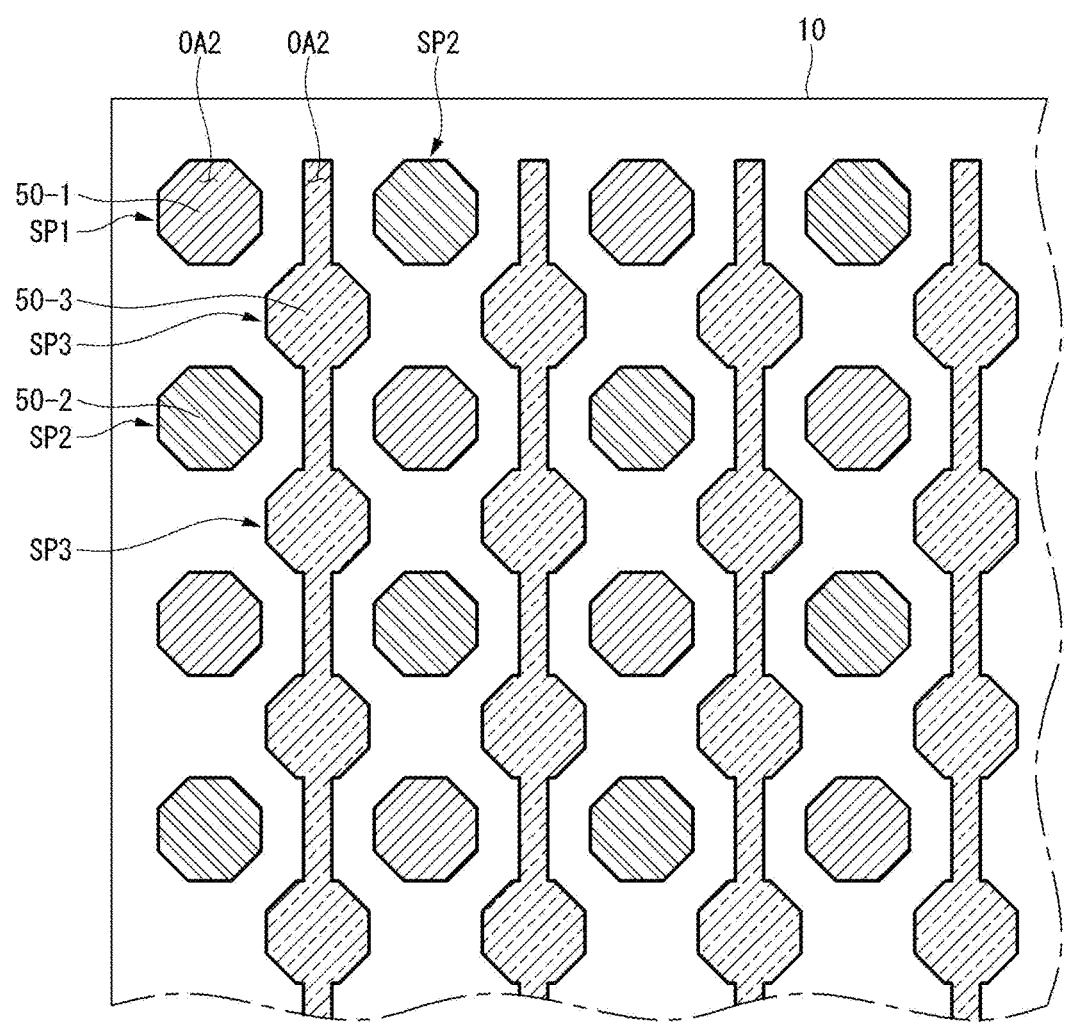
FIG. 3 is a schematic plan view showing an organic emission layer formed on a second opening according to one embodiment of the present disclosure.
Figure 4:
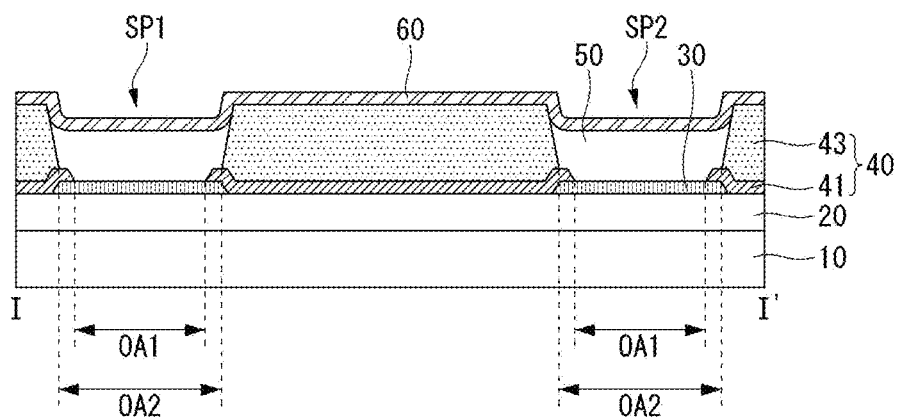
FIG. 4 is cross-sectional views taken along line I-I' of FIG. 2 according to one embodiment of the present disclosure.
Figure 5:
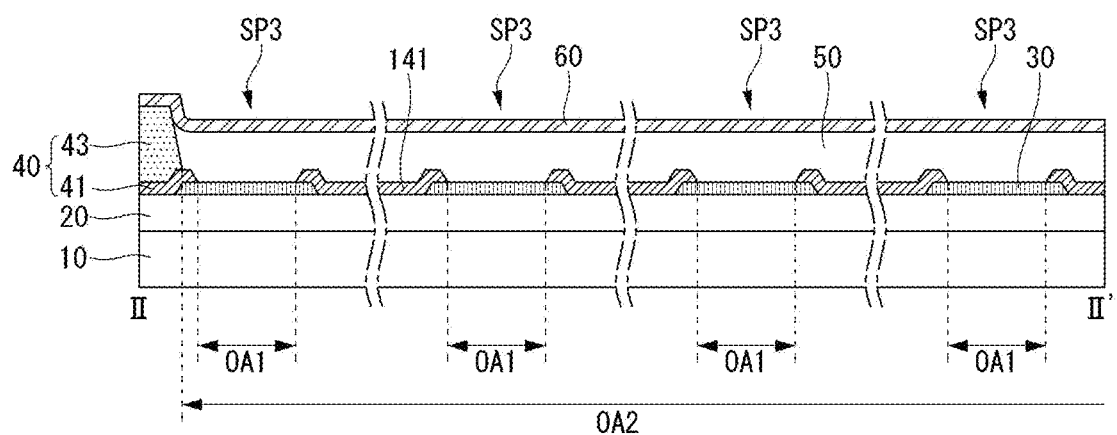
FIG. 5 is cross-sectional views taken along line II-II' of FIG. 2 according to one embodiment of the present disclosure.
Figure 6:
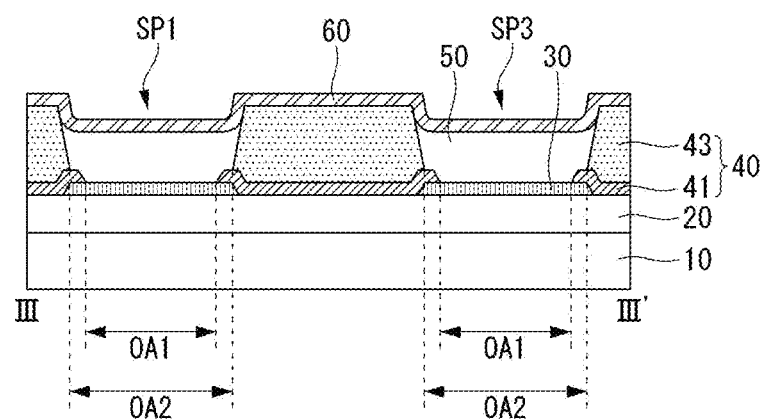
FIG. 6 is cross-sectional views taken along line of FIG. 2 according to one embodiment of the present disclosure.
Figure 7:
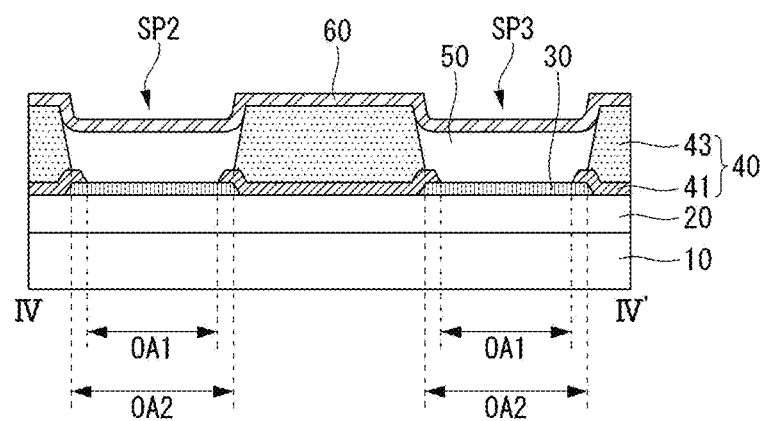
FIG. 7 is a cross-sectional view taken along line IV-IV' of FIG. 2 according to one embodiment of the present disclosure.
Figure 8:
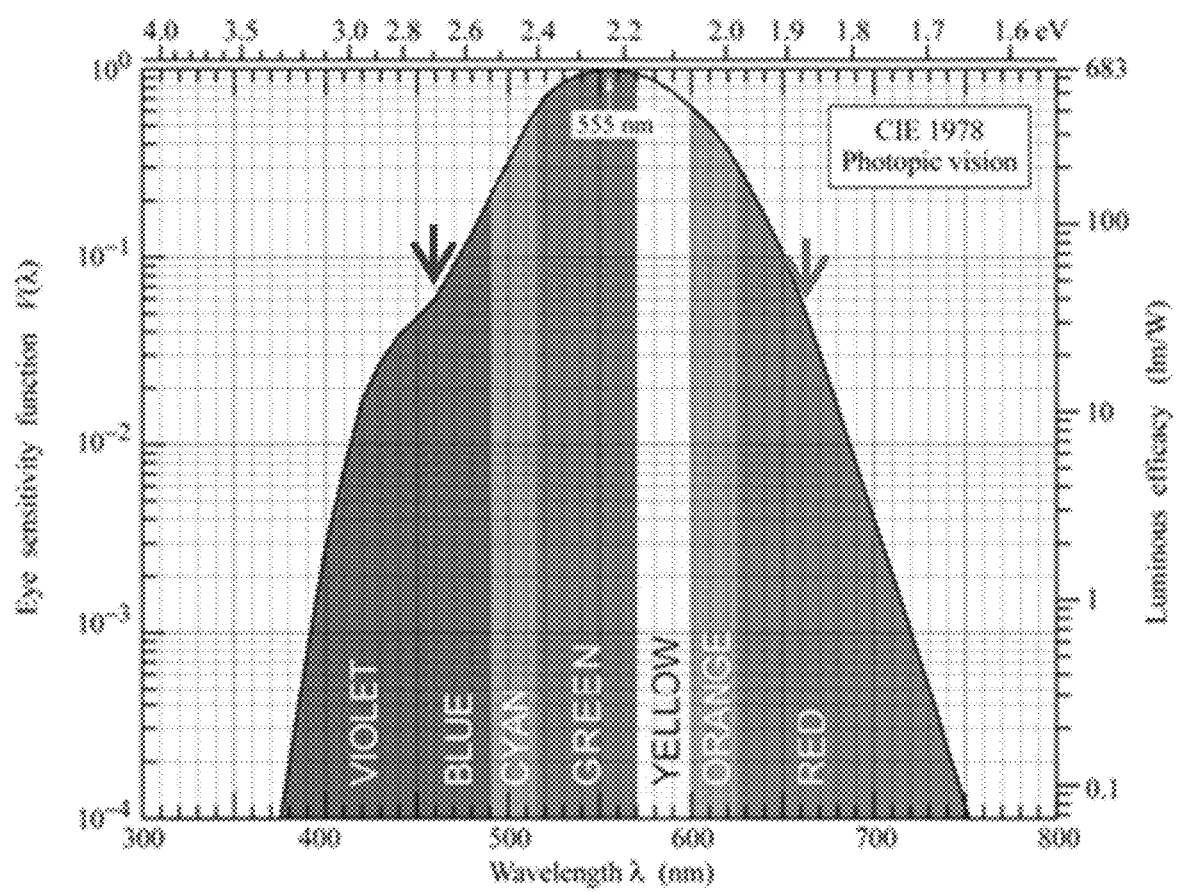
FIG. 8 is a diagram showing human eye sensitivity per color.

FIG. 2 is a schematic plan view showing an organic light emitting display device according to a first embodiment of the present disclosure. FIG. 3 is a schematic plan view showing an organic emission layer formed on a second opening. FIG. 4 is cross-sectional views taken along line I-I' of FIG. 2. FIG. 5 is cross-sectional views taken along line II-II' of FIG. 2. FIG. 6 is cross-sectional views taken along line of FIG. 2. FIG. 7 is a cross-sectional view taken along line IV-IV' of FIG. 2. FIG. 8 is a diagram showing human eye sensitivity per color. FIG. 9 is a diagram for describing the effects (spot recognition level) of the present disclosure. FIG. 10 is a diagram for describing problems when particles remain;

Referring to FIGS. 2 to 7, the organic light emitting display device according to the first embodiment includes a substrate 10 on which sub-pixels SP are arranged. The substrate 10 may have various planar shapes. For example, the substrate 10 may have planar shapes such as square, circular and oval shapes as well as a rectangular shape shown in the figures.

A circuit element layer 20 and organic light-emitting diodes (OLEDs) driven by elements included in the circuit element layer 20 are arranged on the substrate 10.

The circuit element layer 20 may include signal lines and electrodes arranged therein, through which driving signals are applied to the OLEDs, and the signal lines and the electrodes may be separately disposed having at least one insulating layer interposed therebetween as necessary. When the organic light emitting display device is realized as an active matrix (AM) type, the circuit element layer 20 may further include transistors allocated per sub-pixel SP.

Each OLED includes a first electrode 30, a second electrode 60, and an organic emission layer 50 interposed between the first electrode 30 and the second electrode 60. The first electrode 30 may be an anode and the second electrode 60 may be a cathode. The second electrode 60 may contain a bend portion. For example, the second electrode 60 may contain a bent portion at the edge of each sub-pixel, as illustrated in FIG. 4.

More specifically, sub-pixels SP may be arranged in a first direction (e.g., the X direction) and a second direction (e.g., the Y direction) which intersect each other.

For example, the sub-pixels SP may include a first sub-pixel SP1 emitting light in a first color, a second sub-pixel SP2 emitting light in a second color, and a third sub-pixel SP3 emitting light in a third color. The first sub-pixel SP1 and the third sub-pixel SP3 may constitute a single first pixel and the second sub-pixel SP2 and the third sub-pixel SP3 constitute a single second pixel. Here, the first pixel and the second pixel may be alternately arranged in the first direction and alternately arranged in the second direction. Further, the first sub-pixel SP1 and the third sub-pixel SP3 constituting the first pixel may be arranged in a third direction. The second sub-pixel SP2 and the third sub-pixel SP3 constituting the second pixel may be arranged in the third direction. An angle between the third direction and the first direction and an angle between the third direction and the second direction are tilted angles (or tilt angles). This sub-pixel arrangement type can be referred to as a pentile type.

In other words, the first sub-pixels SP1 and the second sub-pixels SP2 can be alternatively arranged in predetermined columns in the second direction. The third sub-pixels SP3 can be sequentially arranged in predetermined columns in the second direction.

For example, odd columns may be columns in which the first sub-pixels SP1 and the second sub-pixels SP2 are alternately arranged. Even columns may be columns in which the third sub-pixels SP3 are sequentially arranged. Although not shown, even columns may be columns in which the first sub-pixels SP1 and the second sub-pixels SP2 are alternately arranged and odd columns may be columns in which the third sub-pixels SP3 are sequentially arranged as another example. The first sub-pixel SP1, the third sub-pixel SP3, and the second sub-pixel SP2 may be alternately arranged zigzag in the second direction in a plan view.

In the following, a case in which the first sub-pixels SP1 and the second sub-pixels SP2 are arranged in odd columns and the third sub-pixels SP3 are arranged in even columns will be described as an example for convenience. The first color may be blue, the second color may be red and the third color may be green, but the present disclosure is not limited thereto.

The first electrode 30 of the OLED is disposed in each sub-pixel SP. The first electrode 30 can be allocated per sub-pixel SP.

A bank 40 is disposed on the first electrodes 30. The bank 40 includes a first bank 41 and a second bank 43.

The first bank 41 is disposed on the first electrode 30. The first bank 41 includes first openings OA1 that expose at least parts of the first electrode 30. One first opening OA1 exposes one first electrode 30. Accordingly, the number of first openings OA1 can correspond to the number of first electrodes 30.

The first bank 41 may be formed relatively thin such that it can be covered by the organic emission layer 50. The first bank 41 may have hydrophilicity. For example, the first bank 41 may be formed of a hydrophilic inorganic insulating material such as silicon oxide (SiO2) or a silicon nitride (SiNx). The first bank 41 is a hydrophilic thin film provided to prevent poor wettability of the first electrodes 30 due to hydrophobicity thereof and allows hydrophilic organic light-emitting materials to well spread. In an embodiment, the first bank 41 and the second bank 43 can be simultaneously formed by using a half-tone mask. For example, the first bank 41 and the second bank can be formed by using a half-tone mask having a semi-transmitting portion corresponding to the second bank 43 and a transmitting portion corresponding to the first bank 41.

Although the figures show a case in which the first openings OA1 have an approximately octagonal shape as an example, the present disclosure is not limited thereto and the first openings OA1 may have various shapes such as circular, oval and polygonal shapes. Further, although the figures show that the first openings OA1 have the same shape and the same area, the present disclosure is not limited thereto and at least one first opening OA1 may have a shape and/or an area different from those of another first opening OA1. For example, the shapes of the first openings OA1 may be appropriately selected in consideration of the lifespan of an organic light-emitting material for forming the organic emission layer 50 of the OLED. Moreover, the first openings OA1 may have the same area or different areas as shown. For example, the areas of the first openings OA1 may be appropriately selected in consideration of the lifespan of an organic light-emitting material for forming the organic emission layer 50 of the OLED. Parts of the first electrodes 30 exposed through the first openings OA1 can be defined as emission regions.

The second bank 43 is positioned on the substrate 10 on which the first bank 41 is formed. The second bank 43 includes second openings OA2 that expose at least parts of the first electrode 30.

Second openings OA2 disposed in odd columns expose first openings OA1 of the first sub-pixels SP1 and first openings OA1 of the second sub-pixels SP2. That is, one second opening OA2 exposes the first opening OA1 of one first sub-pixel SP1 or the first opening OA1 of one second sub-pixel SP2. Accordingly, the number of second openings OA2 can correspond to the number of first openings OA1 in odd columns.

Alternatively, the second openings OA2 disposed in odd columns expose the first electrodes 30 of the first sub-pixels SP1 and the first electrodes 30 of the second sub-pixels SP2. That is, one second opening OA2 exposes the first electrode 30 of one first sub-pixel SP1 or the first electrode 30 of one second sub-pixel SP2. Accordingly, the number of second openings OA2 can correspond to the number of first openings OA1 in odd columns.

Second openings OA2 disposed in even columns extend in the second direction to expose the first openings OA1 of a plurality of third sub-pixels SP3. That is, at least one second opening OA2 can simultaneously expose the first openings OA1 of a plurality of third sub-pixels SP3. Accordingly, the number of second openings OA2 may not correspond to the number of first openings OA1 in even columns.

Alternatively, the second openings OA2 disposed in even columns extend in the second direction to expose the first electrodes 30 of a plurality of third sub-pixels SP3. That is, at least one second opening OA2 can simultaneously expose the first electrodes 30 of a plurality of third sub-pixels SP3. Accordingly, the number of second openings OA2 may not correspond to the number of first openings OA1 in even columns.

The second bank 43 may have hydrophobicity. For example, the second bank 43 may have a structure in which a hydrophobic material is coated on an organic insulating material and may be formed of an organic insulating material containing a hydrophobic material. The second bank 43 may be formed of an organic material. The hydrophobicity of the second bank 43 can prevent the hydrophilic organic light-emitting material from piling up at the edge portion closing to the second bank 43. Therefore, the organic light-emitting material is coated on the first electrodes 30 with a relatively uniform thickness. Further, the second bank 43 can serve as a barrier for confining organic light-emitting materials dropped to corresponding regions such that organic light-emitting materials having different colors can be prevented from being mixed.

The second opening OA2 is separated from the outer circumference of the first opening OA1. That is, the boundary of the first bank 41 is a predetermined distance from the boundary of the second bank 43. Accordingly, the first opening OA1 can be exposed through the second opening OA2.

The organic emission layer 50 is positioned on the substrate 10 on which the second bank 43 is formed. The organic emission layer 50 is disposed in the corresponding second opening OA2. Organic light-emitting materials having different colors may be sequentially alternately dropped to corresponding second openings OA2.

A first organic emission layer 50-1 and a second organic emission layer 50-2 are disposed in second openings OA2 allocated to odd columns. That is, the first organic emission layer 50-1 emitting light in the first color is formed in the second openings OA2 allocated to the first sub-pixels SP1 and the second organic emission layer 50-2 emitting light in the second color is formed in the second openings OA2 allocated to the second sub-pixels SP2 in odd columns. The planar shape of the first organic emission layer 50-1 may correspond to that of the second opening OA2 in which the first organic emission layer 50-1 is formed. The planar shape of the second organic emission layer 50-2 may correspond to that of the second opening OA2 in which the second organic emission layer 50-2 is formed.

A third organic emission layer 50-3 is disposed in the second openings OA2 allocated to even columns. That is, the third organic emission layer 50-3 emitting light in the third color is formed in a direction in which the second openings OA2 extend to cover the first electrodes 30 of a plurality of third sub-pixels SP3 in even columns. In even columns, an organic light-emitting material having the third color dropped to one second opening OA2 covers a plurality of first electrodes 30 and the first bank 41 exposed through the second opening OA2 and is not physically separated by the first bank 41. This means that a plurality of third sub-pixels SP3 allocated to a position corresponding to one second opening OA2 emits lights in the same color, that is, the third color. The planar shape of the third organic emission layer 50-3 may correspond to that of the second opening OA2 in which the third organic emission layer 50-3 is formed.

The second bank 43 is positioned between neighboring second openings OA2 to prevent organic light-emitting materials having different colors deposited to the neighboring second openings OA2 from being mixed. That is, organic light-emitting materials having different colors deposited to different second openings OA2 are physically separated by the second bank 43.

That is, the second bank 43 remains between the first electrodes 30 of the first sub-pixel SP1 and the second sub-pixel SP2 that neighbor in odd columns. The first organic emission layer 50-1 and the second organic emission layer 50-2 are physically separated from each other by the second bank 43.

The second bank 43 remains between the first electrodes 30 of the first sub-pixels SP1 disposed in odd columns and the first electrodes 30 of the third sub-pixels SP3 disposed in even columns. The first organic emission layer 50-1 and the third organic emission layer 50-3 are physically separated from each other by the second bank 43. The second bank 43 remains between the first electrodes 30 of the second sub-pixels SP2 disposed in odd columns and the first electrodes 30 of the third sub-pixels SP3 disposed in even columns. The second organic emission layer 50-2 and the third organic emission layer 50-3 are physically separated from each other by the second bank 43.

An organic light-emitting material used to form the organic emission layer 50 in a solution process is deposited to cover at least parts of the first electrodes 30, parts of the first bank 41 and parts of the second bank 43. The first bank 41 is a hydrophilic thin film provided to prevent poor wettability of the first electrodes 30 due to hydrophobicity thereof and allows hydrophilic organic light-emitting materials to well spread. The second bank 43 is a hydrophobic thick film and can prevent the hydrophilic organic light-emitting material from piling up at the edge portion closing to the second bank 43. The second bank 43 is thicker than the first bank 41. Therefore, the organic light-emitting material is coated on the first electrodes 30 with a relatively uniform thickness. The organic emission layer 50 can be formed to a relatively uniform thickness on emission regions according to a combined structure of the first bank 41 and the second bank 43.

Furthermore, when one second opening OA2 exposes one first electrode 30, an organic light-emitting material having different thicknesses may be deposited to the second openings OA2 due to an equipment deviation in the solution process. The equipment deviation may mean a discharge rate deviation in nozzles of inkjet equipment. That is, nozzles used to deposit an organic light-emitting material to the second openings OA2 may not have a uniform discharge rate. In this case, the organic light-emitting material deposited to sub-pixels SP through nozzles respectively allocated to the sub-pixels SP may have different thicknesses based on location. A thickness deviation is recognized by a user as spot defects and considerably deteriorates display quality.

According to the present disclosure, a plurality of third sub-pixels SP3 can be allocated to one second opening OA2 and a number of nozzles corresponding to the number of third sub-pixels SP3 can be allocated, and thus a discharge rate deviation in nozzles can be compensated and an organic light-emitting material emitting light in the third color deposited to the second openings OA2 can be coated to a uniform thickness.

Particularly, the present disclosure can set the third color emitted from the third sub-pixel SP3 in consideration of human eye sensitivity. That is, the third color may be green. Referring to FIG. 8, it can be ascertained that the sensitivity of green is about ten times or more than the sensitivities of red and blue. Accordingly, the present disclosure can minimize spot defects recognized by a user by allocating green light-emitting layer to the third sub-pixel SP3. Therefore, spot defects due to a thickness deviation in green sub-pixels, which are easily recognized by the user, can be avoid.

Figure 9A:
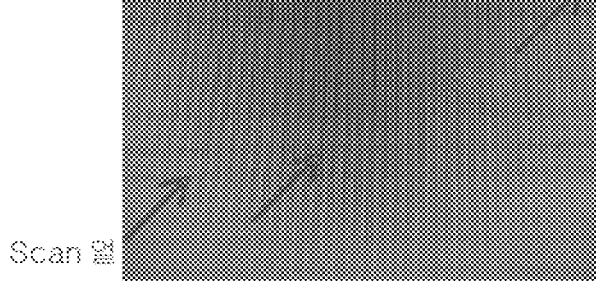
FIGS. 9A and 9B are diagrams for describing the effects (spot recognition level) of the present disclosure.
Figure 9B:
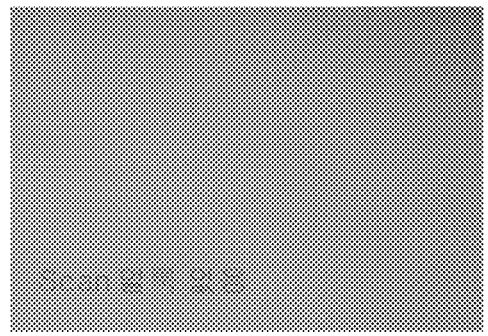
Figure 10:
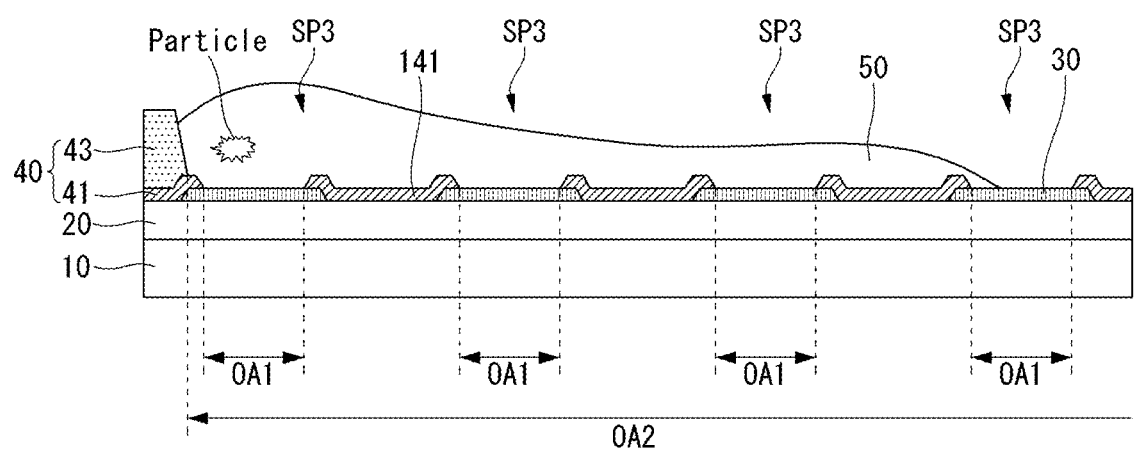
FIG. 10 is a diagram for describing problems when particles remain.

FIG. 9 shows experimental results when the third sub-pixel SP3 is allocated as a green sub-pixel. FIG. 9A shows a spot recognition level when one second opening OA2 exposes one first electrode 30 and FIG. 9B shows a spot recognition level when one second opening OA2 exposes a plurality of first electrodes 30. It can be ascertained that spot defects are considerably improved in an embodiment of the present disclosure shown in FIG. 9B.

Particles may remain on a specific sub-pixel SP when an organic light-emitting material is coated through the solution process. For example, particles can remain on the first electrode 30 of one of a plurality of third sub-pixels SP3 allocated to a certain second opening OA2, as shown in FIG. 10. In this case, the organic light-emitting material does not uniformly spread in the second opening OA2 that simultaneously exposes the first electrodes 30 of the plurality of third sub-pixels SP3 and may be concentrated around the particles. In this case, since the third organic emission layer 50-3 formed of the organic light-emitting material has a thickness deviation based on location, luminance non-uniformity may occur to considerably decrease the display quality of the organic light emitting display device.

To prevent this, the second opening OA2 that simultaneously exposes the first electrodes 30 of a plurality of third sub-pixels SP3 may further include connecting portions 130 having a relatively narrow width. Each connecting portion 130 may be disposed between neighboring third sub-pixel SP3 in predetermined regions. Alternatively, the connecting portion 130 may be disposed between the first electrodes 30 of neighboring third sub-pixels SP3 in predetermined regions.

For example, the first electrodes 30 of a plurality of third sub-pixels SP3 may include (1-1)-th electrodes 30-1 and (1-2)-th electrodes 30-2 simultaneously exposed through a single second opening OA2. Here, the second opening OA2 includes first portions 110 that expose the (1-1)-th electrodes 30-1, second portions 120 that expose the (1-2)-th electrodes 30-2 and the connecting portions 130 that connect the first portions 110 and the second portions 120. The connecting portions 130 have a width less than those of the first and second portions 110 and 120.

The connecting portions 130 having a width less than those of the first and second portions 110 and 120 can be provided to control flow of an organic light-emitting material dropped to the second opening OA2. That is, the present disclosure can allow an organic light-emitting material deposited to the second opening OA2 to flow on a plurality of first electrodes 30 by forming the second opening OA2 that exposes the plurality of first electrodes 30 and limit excessive flow of the organic light-emitting material to a specific region by forming the connecting portions 130.

The present disclosure can minimize concentration of the organic light-emitting material dropped to the second opening OA2 on particles even if the particles remain on a specific third sub-pixel SP3 in the solution process. Accordingly, the present disclosure can effectively prevent luminance non-uniformity due to a thickness deviation in the third organic emission layer 50-3.

The connecting portions 130 can extend between a first sub-pixel SP1 and a second sub-pixel SP2 that neighbor in the first direction in predetermined regions. Alternatively, the connecting portions 130 can extend between first electrodes 30 of a first sub-pixel SP1 and a second sub-pixel SP2 which neighbor in the first direction in predetermined regions. Accordingly, the connecting portions 130 can be disposed in rows in which the first sub-pixels SP1 and the second sub-pixels SP2 are disposed.

In the present disclosure, since the connecting portions 130 having a relatively narrow width are provided, a distance between a first sub-pixel SP1 and a second sub-pixel SP2 which neighbor in the first direction having the connecting portions 130 disposed therebetween can be reduced. This means the areas of the first sub-pixels SP1 and the second sub-pixels SP2 can be set to be relatively large because the first sub-pixels SP1 and the second sub-pixels SP2 can be arranged more densely and thus the aperture ratio can be improved.

Figure 11:
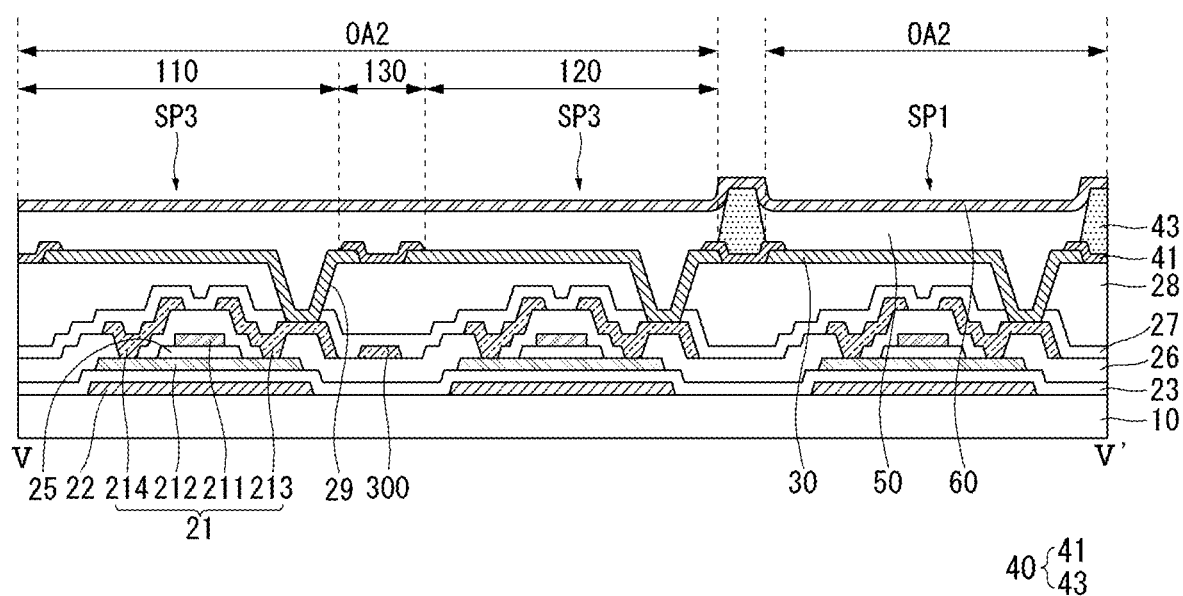
FIG. 11 is a cross-sectional view taken along line V-V' of FIG. 2 according to one embodiment of the present disclosure.

FIG. 11 is a cross-sectional view taken along line V-V' of FIG. 2.

Referring to FIG. 11, the circuit element layer 20 and OLEDs disposed on the circuit element layer 20 are arranged on the substrate 10. The circuit element layer 20 may include a transistor 21 electrically connected to an OLED. For example, the gate electrode 211 of the transistor 21 may be electrically connected to a first electrode 30 of the OLED. In addition, a light shielding layer 22 is disposed on the substrate 10. The light shielding layer 22 serves to block external light to prevent generation of photo current in the transistor. A buffer layer 23 is disposed on the light shielding layer 22. The buffer layer 23 serves to protect transistors formed in a subsequent process from particles such as alkali ions leaking from the light shielding layer 22. The buffer layer 23 may be formed of a silicon oxide (SiOx), a silicon nitride (SiNx) or a multi-layer thereof.

A semiconductor layer 212 of the transistor 21 is disposed on the buffer layer 23 and a capacitor lower electrode may be disposed separately from the semiconductor layer 212. The semiconductor layer 212 and the capacitor lower electrode may be formed of silicon semiconductor or an oxide semiconductor. The silicon semiconductor may include amorphous silicon or crystalized polysilicon. The semiconductor layer 212 includes drain and source regions containing a p-type or n-type impurity, and a channel interposed therebetween. The capacitor lower electrode may also be doped with impurities to be conductive.

A gate insulating layer 25 is disposed on the semiconductor layer 212 and the capacitor lower electrode. The gate insulating layer 25 may be formed of a silicon oxide (SiOx), a silicon nitride (SiNx) or a multi-layer thereof. A gate electrode 211 is disposed on a region of the gate insulating layer 25 which corresponds to a predetermined region of the semiconductor layer 212, that is, the channel where impurities have been injected. The gate electrode 211 is formed of one of molybdenum (Mo), aluminum (Al), chrome (Cr), gold (Au), titanium (Ti), nickel (Ni), neodymium (Nd) or copper (Cu), or an alloy thereof. Further, the gate electrode 211 may be a multi-layer formed of elements selected from one of molybdenum (Mo), aluminum (Al), chrome (Cr), gold (Au), titanium (Ti), nickel (Ni), neodymium (Nd) or copper (Cu), or alloys thereof. For example, the gate electrode 211 may be a double layer of molybdenum/aluminum-neodymium or molybdenum/aluminum.

An interlevel insulating layer 26 for insulating the gate electrode 211 is disposed on the gate electrode 211. The interlevel insulating layer 26 may be formed of a silicon oxide (SiOx), a silicon nitride (SiNx) or a multi-layer thereof. A source electrode 213 and a drain electrode 214 are disposed on the interlevel insulating layer 26. The source electrode 213 and the drain electrode 214 are connected to the semiconductor layer 212 through contact holes that expose the source and drain regions of the semiconductor layer 212. The source electrode 213 and the drain electrode 214 may be formed from a single layer or multi-layer. When the source electrode 213 and the drain electrode 214 are formed from a single layer, they may be formed of molybdenum (Mo), aluminum (Al), chrome (Cr), gold (Au), titanium (Ti), nickel (Ni), neodymium (Nd) or copper (Cu), or an alloy thereof. Further, when the source electrode 213 and the drain electrode 214 are formed from a multi-layer, they may be formed from a double layer of molybdenum/aluminum-neodymium or a triple-layer of titanium/aluminum/titanium, molybdenum/aluminum/molybdenum or molybdenum/aluminum-neodymium/molybdenum. Accordingly, the transistor 21 including the semiconductor layer 212, the gate electrode 211, the source electrode 213 and the drain electrode 214 is formed. Further, the capacitor lower electrode constitutes a capacitor Cst along with the drain electrode 214 serving as a capacitor upper electrode.

A passivation layer 27 is disposed on the substrate 10 including the transistor 21 and the capacitor Cst. The passivation layer 27 is an insulating layer for protecting elements disposed thereunder and may be formed of a silicon oxide (SiOx), a silicon nitride (SiNx) or a multi-layer thereof. An overcoat layer 28 is disposed on the passivation layer 27. The overcoat layer 28 may be a planarization layer for planarizing an uneven surface of the structure disposed thereunder and is made of an organic material such as polyimide, benzocyclobutene series resin or acrylate. The overcoat layer 28 includes a sub-pixel contact hole 29 for exposing the passivation layer 27 to expose the source electrode 213.

An OLED is formed on the overcoat layer 28. The OLED includes the first electrode 30 connected to the transistor, the second electrode 60 opposite the first electrode 30, and the organic emission layer 50 interposed between the first electrode 30 and the second electrode 60. The first electrode 30 may be an anode and the second electrode 60 may be a cathode.

The first electrode 30 may be disposed on the overcoat layer 28 and connected to the source electrode 213 of the transistor through the sub-pixel contact hole 29 penetrating the overcoat layer 28. The first electrode 30 can be allocated per sub-pixel but the present disclosure is not limited thereto. The first electrode 30 may be formed of a transparent conductive material such as indium tin oxide (ITO), indium zinc oxide (IZO) or zinc oxide (ZnO) to serve as a transparent electrode or may include a reflective layer to serve as a reflective electrode in response to an adopted emission method. The reflective layer may be formed of aluminum (Al), copper (Cu), silver (Ag), nickel (Ni) or an alloy thereof. In one embodiment, the reflective layer may be formed of APC (silver/palladium/copper alloy).

The bank 40 is disposed on the substrate 10 on which the first electrode 30 is formed. The bank 40 includes the first bank 41 and the second bank 43. The first bank 41 and the second bank 43 include openings that expose most of the first electrode 30.

The organic emission layer 50 is disposed on the substrate 10 on which the bank 40 is formed. The organic emission layer 50 includes an emission layer (EML) and may further include one or more of common layers such as a hole injection layer (HIL), a hole transport layer (HTL), an electron transport layer (ETL) and an electron injection layer (EIL). The bank 40 includes the first bank 41 and the second bank 43.

The second bank 43 includes second openings OA2 that expose a plurality of first electrodes 30. The second openings OA2 includes first portions 110 and second portions 120 that respectively expose (1-1)-th electrodes 30-1 and (1-2)-th electrodes 30-2 disposed in different columns, and the connecting portions 130 that connect the first portions 110 and the second portions 120.

Transistors 21 allocated to corresponding sub-pixels may be disposed in regions corresponding to the first portions 110 and the second portions 120. Signal lines 300 connected to the transistors 21 to apply driving signals to corresponding sub-pixels may be disposed in the connecting portions 130. The signal lines 300 may include gate lines for applying gate signals to sub-pixels, data lines for applying data signals, a high voltage power line for applying a high-voltage power, and a low voltage power line for applying a low-voltage power. When a compensation circuit is applied to sub-pixels as necessary, the signal lines 300 may further include a sensing line for sensing electrical characteristics of the sub-pixels.

Such signal lines 300 may be disposed in regions corresponding to the connecting portions 130 and extend between the first portions 110 and the second portions 120. In addition, the signal lines 300 may be formed at different levels having one or more insulating layers 23, 26, 27 and 28 interposed therebetween in the regions corresponding to the connecting portions 130. For example, the gate lines may be disposed at the same level as the gate electrode 211. The data lines, the high-voltage power line and the low-voltage power line may be disposed at the same level as the source and drain electrodes 213 and 214. The sensing line may be disposed at the same level as the source and drain electrodes 213 and 214 or disposed at the same level as the light shielding layer 22. One of the signal lines 300 may be divided into a plurality of lines disposed at different levels, and the plurality of divided lines may be electrically connected through contact holes penetrating insulating layers disposed therebetween as necessary.

The second electrode 60 is disposed on the organic emission layer 50. The second electrode 60 may be formed on the overall surface of the substrate 10. The second electrode 60 may serve as a transparent electrode or a reflective electrode in response to an adopted emission method. When the second electrode 60 is a transparent electrode, the second electrode 60 may be formed of a transparent conductive material such as ITO or IZO or formed using a thin film of magnesium (Mg), calcium (Ca), aluminum (Al), silver (Ag) or an alloy thereof, which can allow light to pass therethrough. The structure shown in FIG. 11 can be equally applied to other sub-pixels as well as the corresponding sub-pixel.

Second Embodiment

Figure 12:
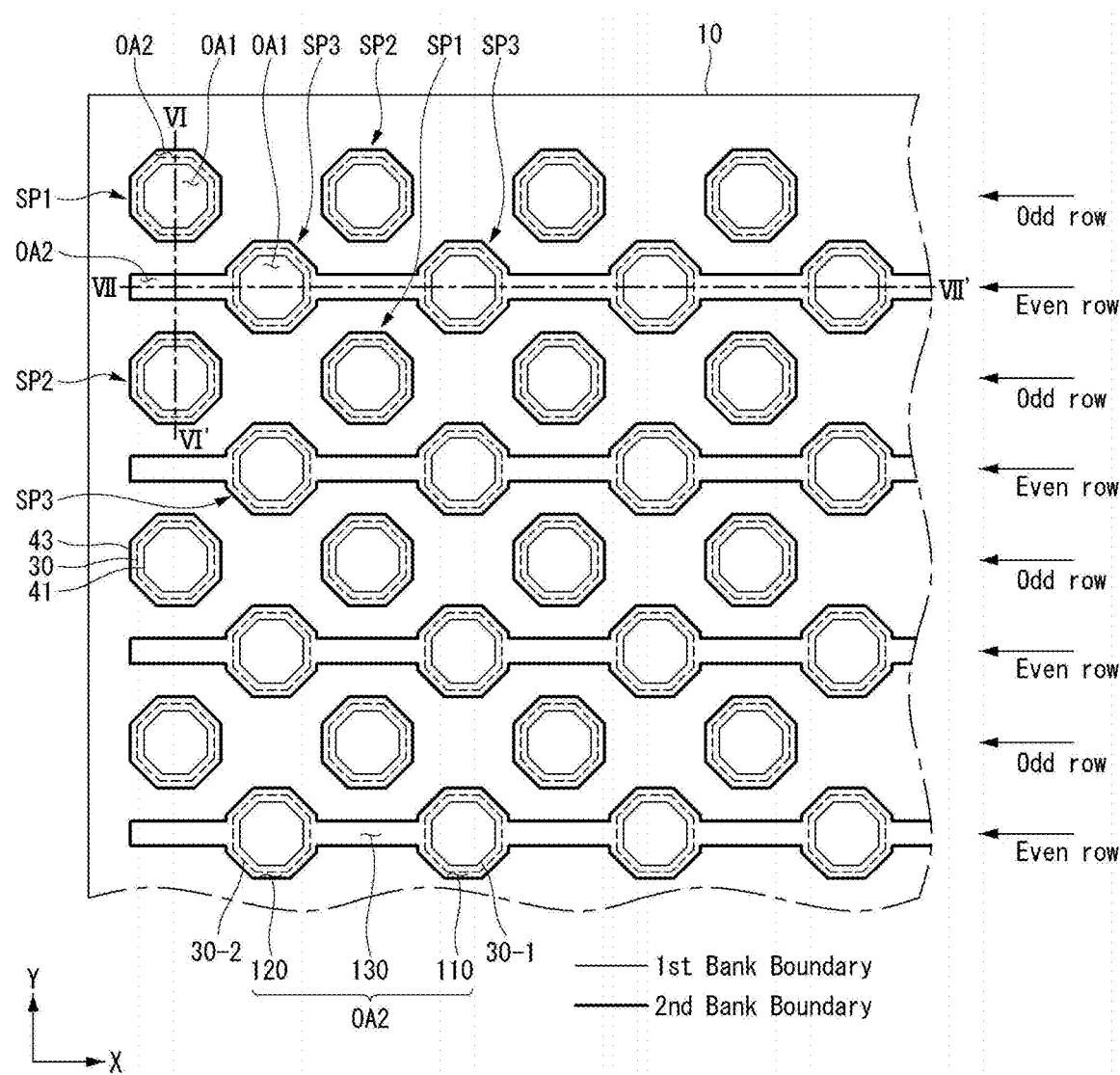
FIG. 12 is a schematic plan view showing an organic light emitting display device according to a second embodiment of the present disclosure.
Figure 13:
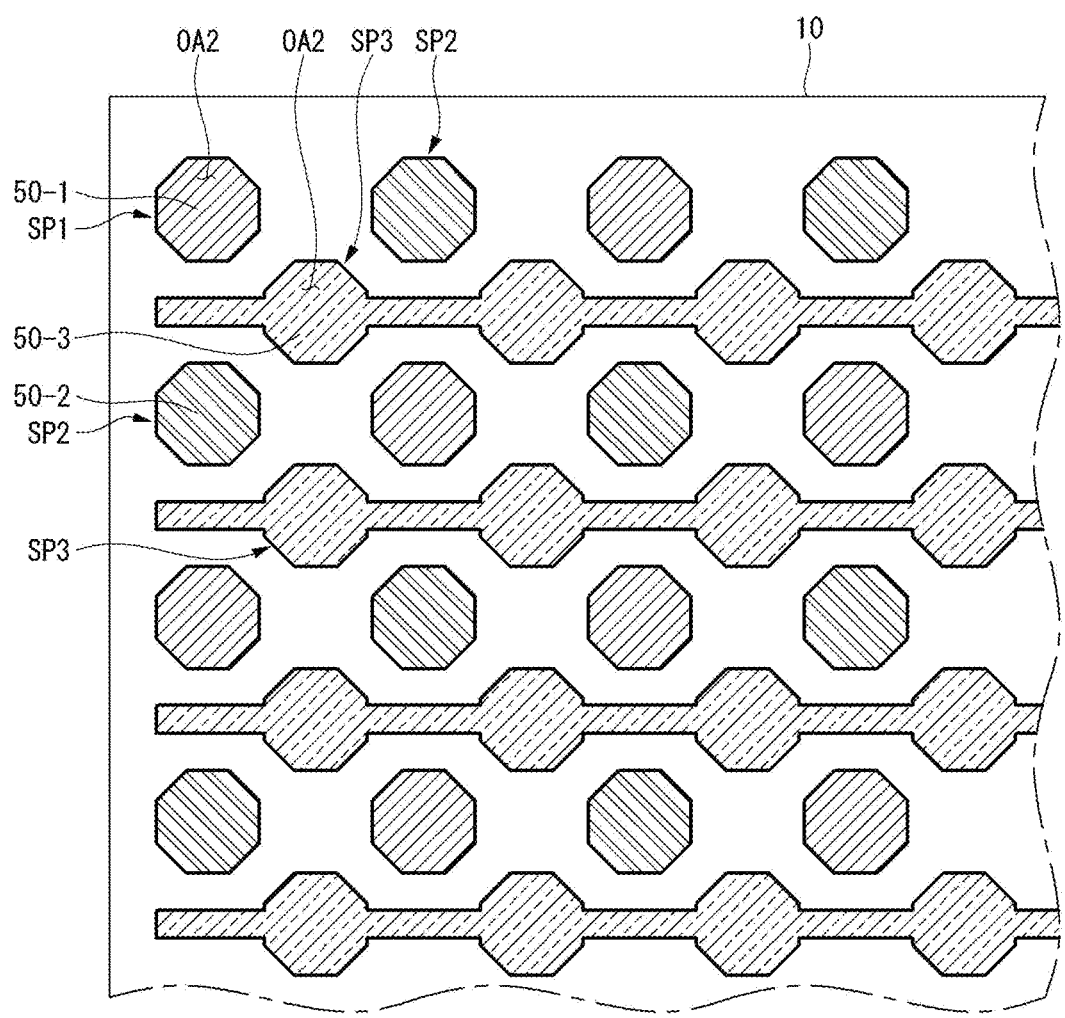
FIG. 13 is a schematic plan view showing an organic emission layer formed in a second opening according to one embodiment of the present disclosure.
Figure 14:
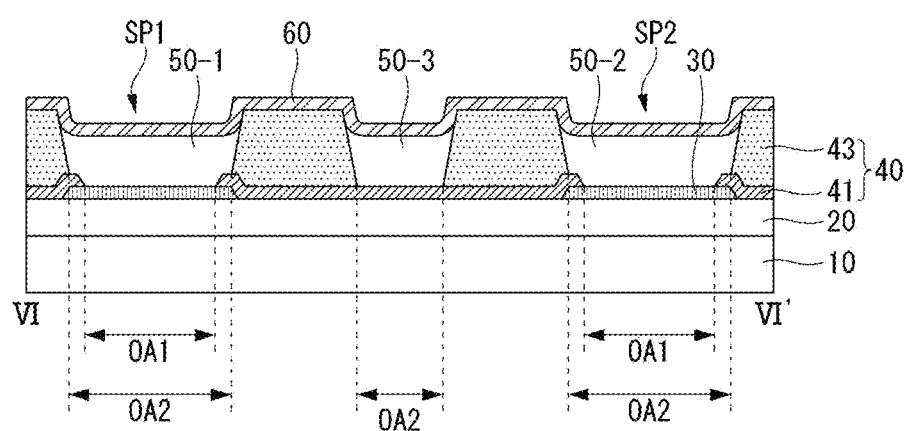
FIG. 14 is cross-sectional views taken along line VI-VI' of FIG. 12 according to one embodiment of the present disclosure.
Figure 15:
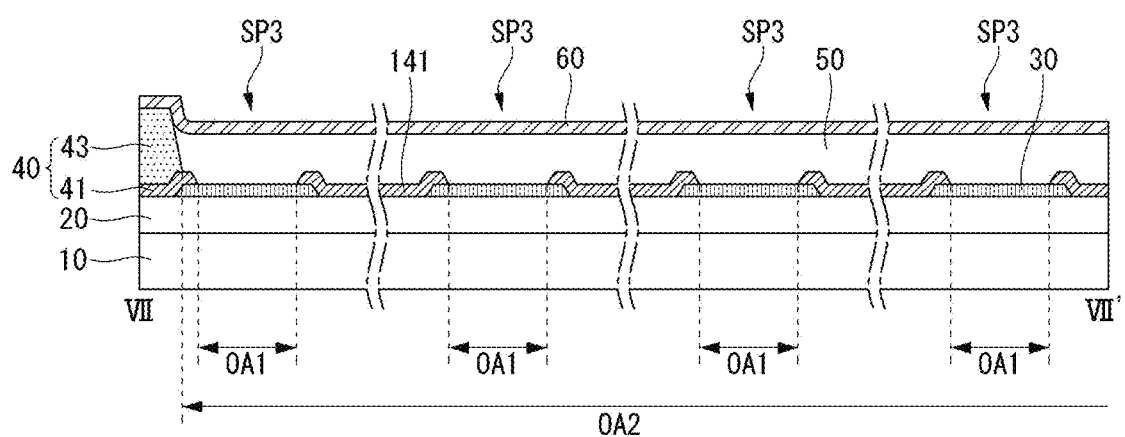
FIG. 15 is cross-sectional views taken along line VII-VII' of FIG. 12 according to one embodiment of the present disclosure.

FIG. 12 is a schematic plan view showing an organic light emitting display device according to a second embodiment of the present disclosure. FIG. 13 is a schematic plan view showing an organic emission layer formed in a second opening. FIG. 14 is cross-sectional views taken along line VI-VI' of FIG. 12. FIG. 15 is cross-sectional views taken along line VII-VII' of FIG. 12.

Referring to FIGS. 12 to 15, the organic light emitting display device according to the second embodiment includes the substrate 10 on which sub-pixels SP are arranged. The substrate 10 may have various planar shapes. For example, the substrate 10 may have planar shapes such as square, circular and oval shapes as well as a rectangular shape shown in the figures.

The circuit element layer 20 and organic light-emitting diodes (OLEDs) driven by elements included in the circuit element layer 20 are arranged on the substrate 10.

The circuit element layer 20 may include signal lines and electrodes arranged therein, through which driving signals are applied to the OLEDs, and the signal lines and the electrodes may be separately disposed having at least one insulating layer interposed therebetween as necessary. When the organic light emitting display device is realized as an active matrix (AM) type, the circuit element layer 20 may further include transistors allocated per sub-pixel SP.

Each OLED includes the first electrode 30, the second electrode 60 and the organic emission layer 50 interposed between the first electrode 30 and the second electrode 60. The first electrode 30 may be an anode and the second electrode 60 may be a cathode.

More specifically, sub-pixels SP may be arranged in the first direction (e.g., the X direction) and the second direction (e.g., the Y direction) which intersect each other.

For example, the sub-pixels SP may include the first sub-pixel SP1 emitting light in a first color, the second sub-pixel SP2 emitting light in a second color, and the third sub-pixel SP3 emitting light in a third color. The first sub-pixel SP1 and the third sub-pixel SP3 may constitute a single first pixel and the second sub-pixel SP2 and the third sub-pixel SP3 constitute a single second pixel. Here, the first pixel and the second pixel may be alternately arranged in the first direction and alternately arranged in the second direction. Further, the first sub-pixel SP1 and the third sub-pixel SP3 constituting the first pixel may be arranged in the third direction and the second sub-pixel SP2 and the third sub-pixel SP3 constituting the second pixel may be arranged in the third direction. An angle between the third direction and the first direction and an angle between the third direction and the second direction are tilted angles (or tilt angles). This sub-pixel arrangement type can be referred to as a pentile type.

In other words, the first sub-pixels SP1 and the second sub-pixels SP2 can be alternatively arranged in predetermined lows in the first direction. The third sub-pixels SP3 can be sequentially arranged in predetermined lows in the first direction.

For example, odd rows may be rows in which the first sub-pixels SP1 and the second sub-pixels SP2 are alternately arranged and even rows may be rows in which the third sub-pixels SP3 are sequentially arranged. Although not shown, even rows may be rows in which the first sub-pixels SP1 and the second sub-pixels SP2 are alternately arranged and odd rows may be rows in which the third sub-pixels SP3 are sequentially arranged as another example. The first sub-pixel SP1, the third sub-pixel SP3 and the second sub-pixel SP2 may be alternately arranged zigzag in the second direction in a plan view.

In the following, a case in which the first sub-pixels SP1 and the second sub-pixels SP2 are arranged in odd rows and the third sub-pixels SP3 are arranged in even rows will be described as an example for convenience. The first color may be blue, the second color may be red and the third color may be green, but the present disclosure is not limited thereto.

The first electrode 30 of the OLED is disposed in each sub-pixel SP. The first electrode 30 can be allocated per sub-pixel SP.

The bank 40 is disposed on the first electrodes 30. The bank 40 includes the first bank 41 and the second bank 43.

The first bank 41 is disposed on the first electrode 30. The first bank 41 includes first openings OA1 that expose at least a part of the first electrode 30. One first opening OA1 exposes one first electrode 30. Accordingly, the number of first openings OA1 can correspond to the number of first electrodes 30.

The first bank 41 may be formed relatively thin such that it can be covered by the organic emission layer 50. The first bank 41 may have hydrophilicity. For example, the first bank 41 may be formed of a hydrophilic inorganic insulating material such as silicon oxide (SiO2) or a silicon nitride (SiNx).

Although the figures show a case in which the first openings OA1 have an approximately octagonal shape as an example, the present disclosure is not limited thereto and the first openings OA1 may have various shapes such as circular, oval and polygonal shapes. Further, although the figures show that the first openings OA1 have the same shape and the same area, the present disclosure is not limited thereto and at least one first opening OA1 may have a shape and/or an area different from those of another first opening OA1. For example, the shapes of the first openings OA1 may be appropriately selected in consideration of the lifespan of an organic light-emitting material for forming the organic emission layer 50 of the OLED. Moreover, the first openings OA1 may have the same area or different areas as shown. For example, the areas of the first openings OA1 may be appropriately selected in consideration of the lifespan of an organic light-emitting material for forming the organic emission layer 50 of the OLED. Parts of the first electrodes 30 exposed through the first openings OA1 can be defined as emission regions.

The second bank 43 is positioned on the substrate 10 on which the first bank 41 is formed. The second bank 43 includes second openings OA2 that expose at least a part of the first electrode 30.

Second openings OA2 disposed in odd rows expose first openings OA1 of the first sub-pixels SP1 and first openings OA1 of the second sub-pixels SP2. That is, a single second opening OA2 exposes the first opening OA1 of a single first sub-pixel SP1 or the first opening OA1 of a single second sub-pixel SP2. Accordingly, the number of second openings OA2 can correspond to the number of first openings OA1 in odd rows.

Alternatively, the second openings OA2 disposed in odd rows expose the first electrodes 30 of the first sub-pixels SP1 and the first electrodes 30 of the second sub-pixels SP2. That is, a single second opening OA2 exposes the first electrode 30 of a single first sub-pixel SP1 or the first electrode 30 of a single second sub-pixel SP2. Accordingly, the number of second openings OA2 can correspond to the number of first openings OA1 in odd rows.

Second openings OA2 disposed in even rows extend in the first direction to expose the first openings OA1 of a plurality of third sub-pixels SP3. That is, at least one second opening OA2 can simultaneously expose the first openings OA1 of a plurality of third sub-pixels SP3. Accordingly, the number of second openings OA2 may not correspond to the number of first openings OA1 in even rows.

Alternatively, the second openings OA2 disposed in even rows extend in the first direction to expose the first electrodes 30 of a plurality of third sub-pixels SP3. That is, at least one second opening OA2 can simultaneously expose the first electrodes 30 of a plurality of third sub-pixels SP3. Accordingly, the number of second openings OA2 may not correspond to the number of first openings OA1 in even rows.

The second bank 43 may have hydrophobicity. For example, the second bank 43 may have a structure in which a hydrophobic material is coated on an organic insulating material and may be formed of an organic insulating material containing a hydrophobic material. The second bank 43 may be formed of an organic material. The hydrophobicity of the second bank 43 can prevent the hydrophilic organic light-emitting material from piling up at the edge portion closing to the second bank 43. Therefore, the organic light-emitting material is coated on the first electrodes 30 with a relatively uniform thickness. Further, the second bank 43 can serve as a barrier for confining organic light-emitting materials dropped to corresponding regions such that organic light-emitting materials having different colors can be prevented from being mixed.

The second opening OA2 is separated from the outer circumference of the first opening OA1. That is, the boundary of the first bank 41 is a predetermined distance from the boundary of the second bank 43. Accordingly, the first opening OA1 can be exposed through the second opening OA2.

The organic emission layer 50 is positioned on the substrate 10 on which the second bank 43 is formed. The organic emission layer 50 is disposed in the corresponding second opening OA2. Organic light-emitting materials having different colors may be sequentially alternately dropped to corresponding second openings OA2.

The first organic emission layer 50-1 and the second organic emission layer 50-2 are disposed in second openings OA2 allocated to odd rows. That is, the first organic emission layer 50-1 emitting light in the first color is formed in the second openings OA2 allocated to the first sub-pixels SP1 and the second organic emission layer 50-2 emitting light in the second color is formed in the second openings OA2 allocated to the second sub-pixels SP2 in odd rows. The planar shape of the first organic emission layer 50-1 may correspond to that of the second opening OA2 in which the first organic emission layer 50-1 is formed. The planar shape of the second organic emission layer 50-2 may correspond to that of the second opening OA2 in which the second organic emission layer 50-2 is formed.

The third organic emission layer 50-3 is disposed in the second openings OA2 allocated to even rows. That is, the third organic emission layer 50-3 emitting light in the third color is formed in a direction in which the second openings OA2 extend to cover the first electrodes 30 of a plurality of third sub-pixels SP3 in even rows. In even rows, an organic light-emitting material having the third color dropped to one second opening OA2 covers a plurality of first electrodes 30 and the first bank 41 exposed through the second opening OA2 and is not physically separated by the first bank 41. This means that a plurality of third sub-pixels SP3 allocated to a position corresponding to one second opening OA2 emits lights in the same color, that is, the third color. The planar shape of the third organic emission layer 50-3 may correspond to that of the second opening OA2 in which the third organic emission layer 50-3 is formed.

The second bank 43 is positioned between neighboring second openings OA2 to prevent organic light-emitting materials having different colors dropped to the neighboring second openings OA2 from being mixed. That is, organic light-emitting materials having different colors dropped to different second openings OA2 are physically separated by the second bank 43.

That is, the second bank 43 remains between the first electrodes 30 of the first sub-pixel SP1 and the second sub-pixel SP2 which neighbor in odd rows. The first organic emission layer 50-1 and the second organic emission layer 50-2 are physically separated from each other by the second bank 43.

The second bank 43 remains between the first electrodes 30 of the first sub-pixels SP1 disposed in odd rows and the first electrodes 30 of the third sub-pixels SP3 disposed in even rows. The first organic emission layer 50-1 and the third organic emission layer 50-3 are physically separated from each other by the second bank 43. The second bank 43 remains between the first electrodes 30 of the second sub-pixels SP2 disposed in odd rows and the first electrodes 30 of the third sub-pixels SP3 disposed in even rows. The second organic emission layer 50-2 and the third organic emission layer 50-3 are physically separated from each other by the second bank 43.

An organic light-emitting material used to form the organic emission layer 50 in the solution process is deposited to cover at least parts of the first electrodes 30, parts of the first bank 41 and parts of the second bank 43. The first bank 41 is a hydrophilic thin film provided to prevent poor wettability of the first electrodes 30 due to hydrophobicity thereof and allows hydrophilic organic light-emitting materials to well spread. The second bank 43 is a hydrophobic thick film and can prevent the hydrophilic organic light-emitting material from piling up at the edge portion closing to the second bank 43. Therefore, the organic light-emitting material is coated on the first electrodes 30 with a relatively uniform thickness. The organic emission layer 50 can be formed to a relatively uniform thickness on emission regions according to a combined structure of the first bank 41 and the second bank 43.

Furthermore, when the second openings OA2 respectively expose the first electrodes 30, an organic light-emitting material may be dropped to different thickness to the second openings OA2 due to an equipment deviation in the solution process. The equipment deviation may mean a discharge rate deviation in nozzles of inkjet equipment. That is, nozzles used to deposit an organic light-emitting material to the second openings OA2 may not have a uniform discharge rate. In this case, the organic light-emitting material deposited to sub-pixels SP through nozzles respectively allocated to the sub-pixels SP may have different thicknesses based on location. A thickness deviation is recognized by a user as spot defects and considerably deteriorates display quality.

According to the present disclosure, a plurality of third sub-pixels SP3 can be allocated to one second opening OA2 and a number of nozzles corresponding to the number of third sub-pixels SP3 can be allocated, and thus a discharge rate deviation in nozzles can be compensated and an organic light-emitting material emitting light in the third color dropped to the second openings OA2 can be coated to a uniform thickness.

The second opening OA2 that simultaneously exposes the first electrodes 30 of the third sub-pixels SP3 may further include connecting portions 130 having a relatively narrow width. Each connecting portion 130 may be disposed between neighboring third sub-pixel SP3 in predetermined regions. Alternatively, the connecting portion 130 may be disposed between the first electrodes 30 of neighboring third sub-pixels SP3 in predetermined regions.

For example, the first electrodes 30 of the third sub-pixels SP3 may include (1-1)-th electrodes 30-1 and (1-2)-th electrodes 30-2 simultaneously exposed through a single second opening OA2. Here, the second opening OA2 includes first portions 110 that expose the (1-1)-th electrodes 30-1, second portions 120 that expose the (1-2)-th electrodes 30-2 and the connecting portions 130 that connect the first portions 110 and the second portions 120. The connecting portions 130 have a width less than those of the first and second portions 110 and 120.

The connecting portions 130 having a width less than those of the first and second portions 110 and 120 can be provided to control flow of an organic light-emitting material dropped to the second opening OA2. That is, the present disclosure can allow an organic light-emitting material dropped to the second opening OA2 to flow on a plurality of first electrodes 30 by forming the second opening OA2 that exposes the plurality of first electrodes 30 and limit excessive flow of the organic light-emitting material to a specific region by forming the connecting portions 130.

The present disclosure can reduce concentration of the organic light-emitting material deposited to the second opening OA2 on particles even if the particles remain on a specific third sub-pixel SP3 in the solution process. Accordingly, the present disclosure can effectively prevent luminance non-uniformity due to a thickness deviation in the third organic emission layer 50-3.

The connecting portions 130 can extend between a first sub-pixel SP1 and a second sub-pixel SP2 that neighbor in the second direction in predetermined regions. Alternatively, the connecting portions 130 can extend between first electrodes 30 of a first sub-pixel SP1 and a second sub-pixel SP2 which neighbor in the second direction in predetermined regions. Accordingly, the connecting portions 130 can be disposed in columns in which the first sub-pixels SP1 and the second sub-pixels SP2 are disposed.

In the present disclosure, since the connecting portions 130 having a relatively narrow width are provided, a distance between a first sub-pixel SP1 and a second sub-pixel SP2 which neighbor in the second direction having the connecting portions 130 disposed therebetween can be reduced. This means the areas of the first sub-pixels SP1 and the second sub-pixels SP2 can be set to be relatively large because the first sub-pixels SP1 and the second sub-pixels SP2 can be arranged more densely and thus the aperture ratio can be improved.

Third Embodiment

Figure 16:
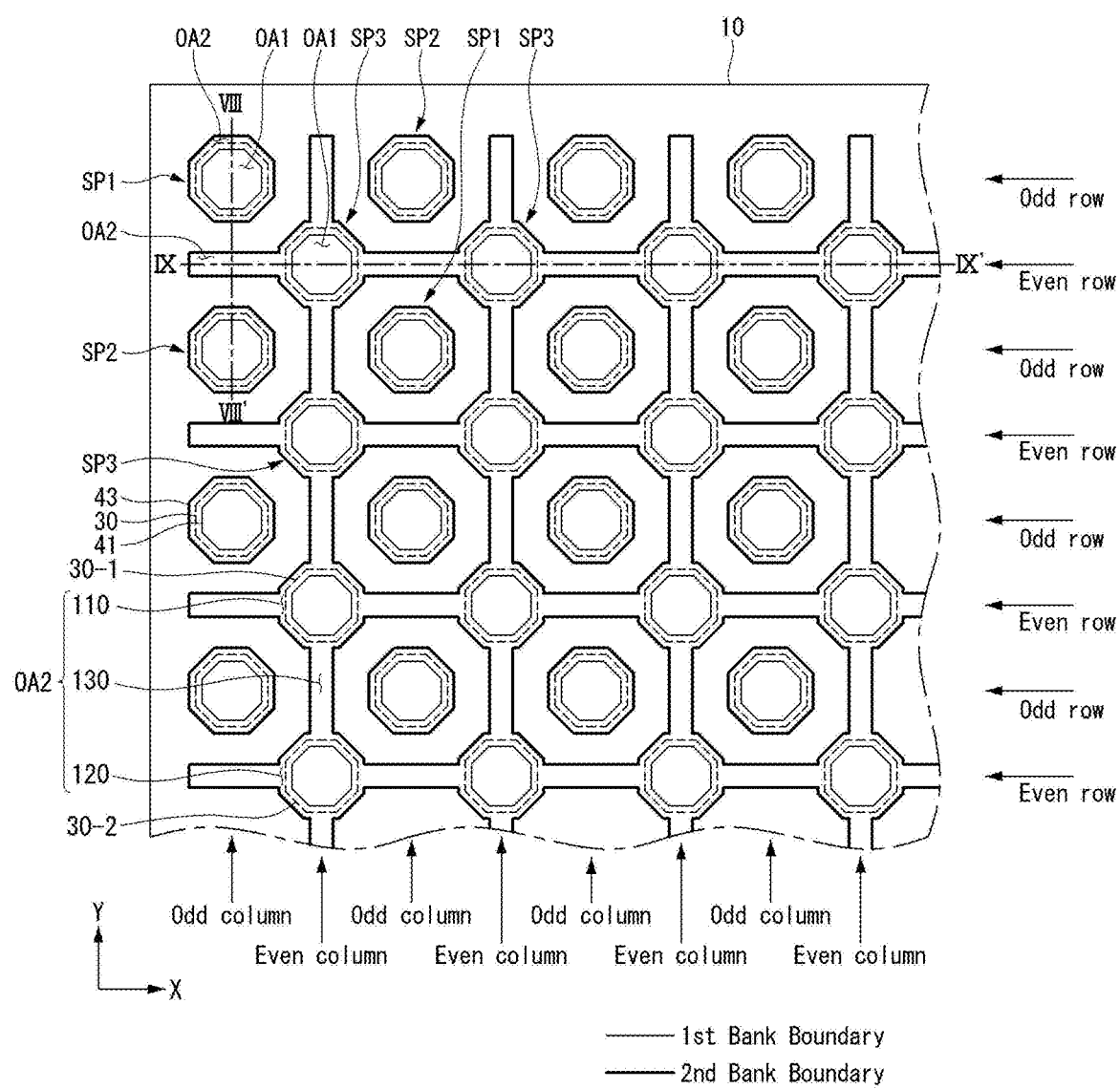
FIG. 16 is a schematic plan view showing an organic light emitting display device according to a third embodiment of the present disclosure.
Figure 17:
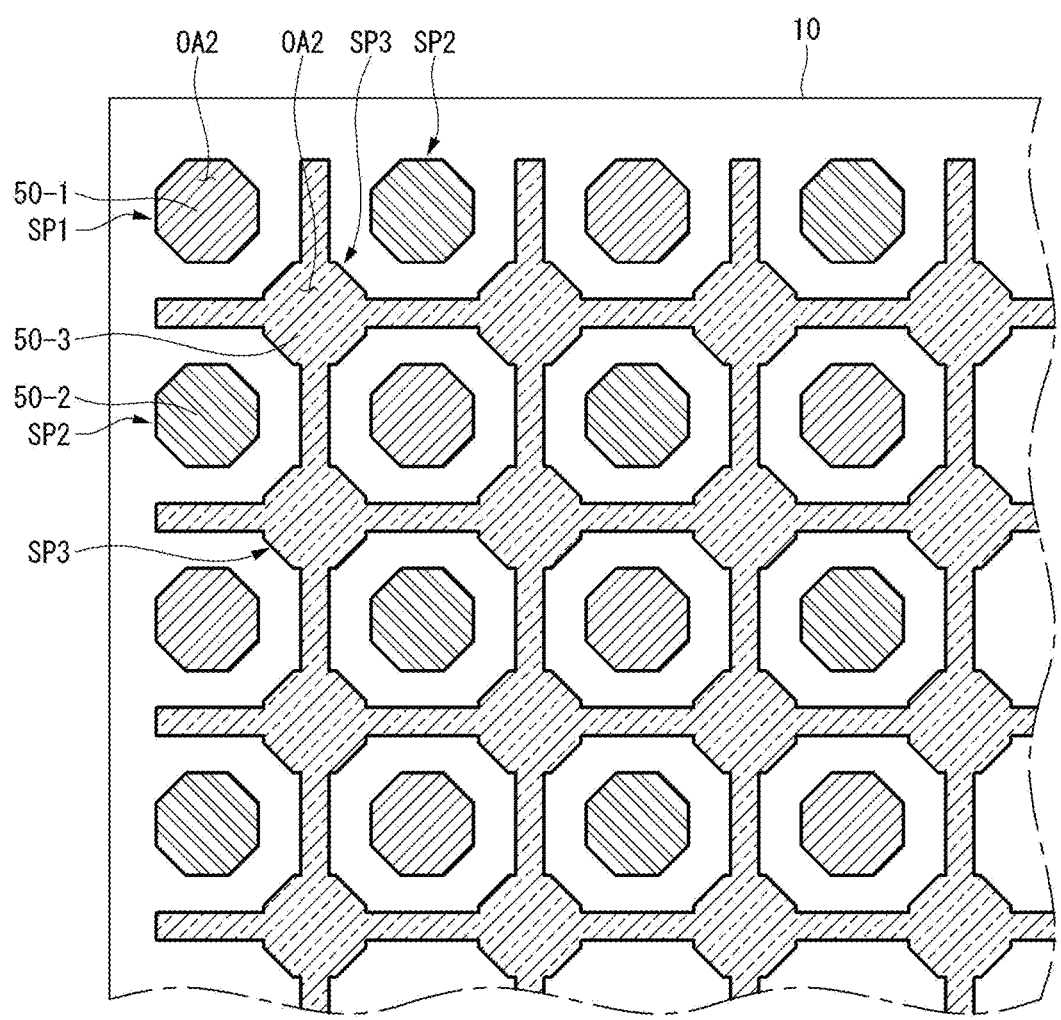
FIG. 17 is a schematic plan view showing an organic emission layer formed in a second opening according to one embodiment of the present disclosure.
Figure 18:
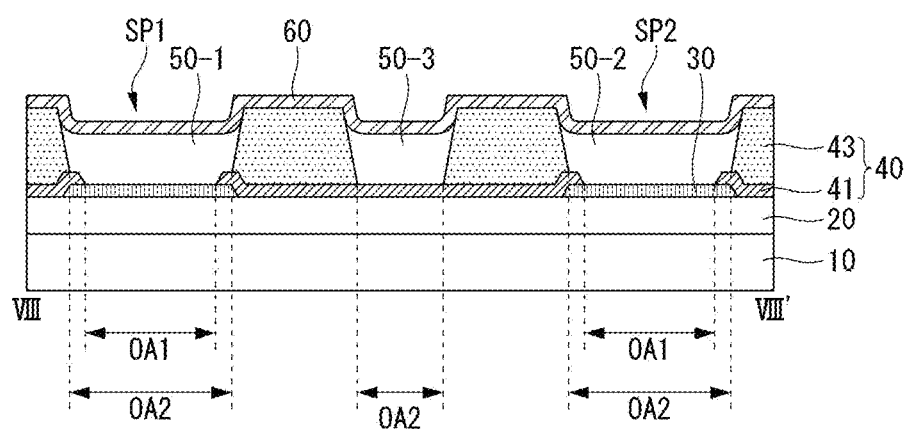
FIG. 18 is cross-sectional views taken along line VIII-VIII' of FIG. 16 according to one embodiment of the present disclosure.
Figure 19:
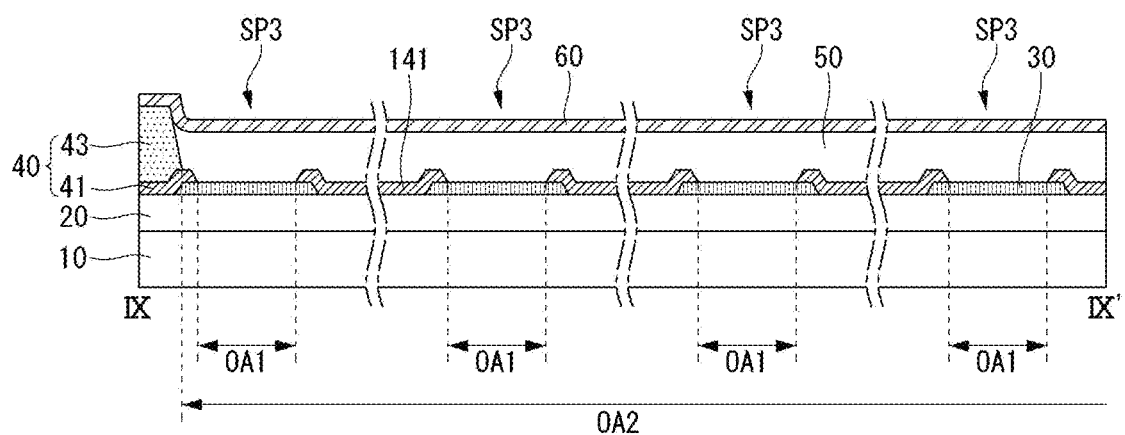
FIG. 19 is cross-sectional views taken along line IX-IX' of FIG. 16 according to one embodiment of the present disclosure.

FIG. 16 is a schematic plan view showing an organic light emitting display device according to a third embodiment of the present disclosure. FIG. 17 is a schematic plan view showing an organic emission layer formed in a second opening. FIG. 18 is cross-sectional views taken along line VIII-VIII' of FIG. 16. FIG. 19 is cross-sectional views taken along line IX-IX' of FIG. 16.

Referring to FIGS. 16 to 19, the organic light emitting display device according to the third embodiment includes the substrate 10 on which sub-pixels SP are arranged. The substrate 10 may have various planar shapes. For example, the substrate 10 may have planar shapes such as square, circular and oval shapes as well as a rectangular shape shown in the figures.

The circuit element layer 20 and organic light-emitting diodes (OLEDs) driven by elements included in the circuit element layer 20 are arranged on the substrate 10.

The circuit element layer 20 may include signal lines and electrodes arranged therein, through which driving signals are applied to the OLEDs, and the signal lines and the electrodes may be separately disposed having at least one insulating layer interposed therebetween as necessary. When the organic light emitting display device is realized as an active matrix (AM) type, the circuit element layer 20 may further include transistors allocated per sub-pixel SP.

Each OLED includes the first electrode 30, the second electrode 60 and the organic emission layer 50 interposed between the first electrode 30 and the second electrode 60. The first electrode 30 may be an anode and the second electrode 60 may be a cathode.

More specifically, sub-pixels SP may be arranged in the first direction (e.g., the X direction) and the second direction (e.g., the Y direction) which intersect each other.

For example, the sub-pixels SP may include the first sub-pixel SP1 emitting light in a first color, the second sub-pixel SP2 emitting light in a second color, and the third sub-pixel SP3 emitting light in a third color. The first sub-pixel SP1 and the third sub-pixel SP3 may constitute a single first pixel and the second sub-pixel SP2 and the third sub-pixel SP3 constitute a single second pixel. Here, the first pixel and the second pixel may be alternately arranged in the first direction and alternately arranged in the second direction. Further, the first sub-pixel SP1 and the third sub-pixel SP3 constituting the first pixel may be arranged in the third direction and the second sub-pixel SP2 and the third sub-pixel SP3 constituting the second pixel may be arranged in the third direction. An angle between the third direction and the first direction and an angle between the third direction and the second direction are tilted angles (or tilt angles). This sub-pixel arrangement type can be referred to as a pentile type.

In other words, the first sub-pixels SP1 and the second sub-pixels SP2 can be alternatively arranged in predetermined columns and predetermined lows in the first direction. The third sub-pixels SP3 can be sequentially arranged in predetermined columns and predetermined lows in the first direction.

For example, odd columns may be columns in which the first sub-pixels SP1 and the second sub-pixels SP2 are alternately arranged and even columns may be columns in which the third sub-pixels SP3 are sequentially arranged. Although not shown, even columns may be columns in which the first sub-pixels SP1 and the second sub-pixels SP2 are alternately arranged and odd columns may be columns in which the third sub-pixels SP3 are sequentially arranged as another example. The first sub-pixel SP1, the third sub-pixel SP3, and the second sub-pixel SP2 may be alternately arranged zigzag in the second direction in a plan view.

In the following, a case in which the first sub-pixels SP1 and the second sub-pixels SP2 are arranged in odd columns and the third sub-pixels SP3 are arranged in even columns will be described as an example for convenience.

For example, odd rows may be rows in which the first sub-pixels SP1 and the second sub-pixels SP2 are alternately arranged and even rows may be rows in which the third sub-pixels SP3 are sequentially arranged. Although not shown, even rows may be rows in which the first sub-pixels SP1 and the second sub-pixels SP2 are alternately arranged and odd rows may be rows in which the third sub-pixels SP3 are sequentially arranged as another example. The first sub-pixel SP1, the third sub-pixel SP3 and the second sub-pixel SP2 may be alternately arranged zigzag in the second direction in a plan view.

In the following, a case in which the first sub-pixels SP1 and the second sub-pixels SP2 are arranged in odd rows and the third sub-pixels SP3 are arranged in even rows will be described as an example for convenience.

The first electrode 30 of the OLED is disposed in each sub-pixel SP. The first electrode 30 can be allocated per sub-pixel SP.

The bank 40 is disposed on the first electrodes 30. The bank 40 includes the first bank 41 and the second bank 43.

The first bank 41 is disposed on the first electrode 30. The first bank 41 includes first openings OA1 that expose at least a part of the first electrode 30. One first opening OA1 exposes one first electrode 30. Accordingly, the number of first openings OA1 can correspond to the number of first electrodes 30.

The first bank 41 may be formed relatively thin such that it can be covered by the organic emission layer 50. The first bank 41 may have hydrophilicity. For example, the first bank 41 may be formed of a hydrophilic inorganic insulating material such as silicon oxide (SiO2) or a silicon nitride (SiNx).

Although the figures show a case in which the first openings OA1 have an approximately octagonal shape as an example, the present disclosure is not limited thereto and the first openings OA1 may have various shapes such as circular, oval and polygonal shapes. Further, although the figures show that the first openings OA1 have the same shape and the same area, the present disclosure is not limited thereto and at least one first opening OA1 may have a shape and/or an area different from those of another first opening OA1. For example, the shapes of the first openings OA1 may be appropriately selected in consideration of the lifespan of an organic light-emitting material for forming the organic emission layer 50 of the OLED. Moreover, the first openings OA1 may have the same area or different areas as shown. For example, the areas of the first openings OA1 may be appropriately selected in consideration of the lifespan of an organic light-emitting material for forming the organic emission layer 50 of the OLED. Parts of the first electrodes 30 exposed through the first openings OA1 can be defined as emission regions.

The second bank 43 is positioned on the substrate 10 on which the first bank 41 is formed. The second bank 43 includes second openings OA2 that expose at least a part of the first electrode 30.

Second openings OA2 disposed in odd columns and odd rows expose first openings OA1 of the first sub-pixels SP1 and first openings OA1 of the second sub-pixels SP2. That is, a single second opening OA2 exposes the first opening OA1 of a single first sub-pixel SP1 or the first opening OA1 of a single second sub-pixel SP2. Accordingly, the number of second openings OA2 can correspond to the number of first openings OA1 in odd columns and odd rows.

Alternatively, the second openings OA2 disposed in odd columns and odd rows expose the first electrodes 30 of the first sub-pixels SP1 and the first electrodes 30 of the second sub-pixels SP2. That is, a single second opening OA2 exposes the first electrode 30 of a single first sub-pixel SP1 or the first electrode 30 of a single second sub-pixel SP2. Accordingly, the number of second openings OA2 can correspond to the number of first openings OA1 in odd columns and odd rows.

Second openings OA2 disposed in even columns and even rows extend in the first direction and the second direction to expose the first openings OA1 of a plurality of third sub-pixels SP3 disposed in the even columns and the even rows. That is, at least one second opening OA2 can simultaneously expose the first openings OA1 of a plurality of third sub-pixels SP3 disposed in the even columns and the even rows. Accordingly, the number of second openings OA2 may not correspond to the number of first openings OA1 in even columns and even rows.

Alternatively, the second openings OA2 disposed in even columns and even rows extend in the first direction and the second direction to expose the first electrodes 30 of a plurality of third sub-pixels SP3 disposed in the even columns and the even rows. That is, at least one second opening OA2 can simultaneously expose the first electrodes 30 of a plurality of third sub-pixels SP3 disposed in the even columns and the even rows. Accordingly, the number of second openings OA2 may not correspond to the number of first openings OA1 in even columns and even rows.

The second bank 43 may have hydrophobicity. For example, the second bank 43 may have a structure in which a hydrophobic material is coated on an organic insulating material and may be formed of an organic insulating material containing a hydrophobic material. The second bank 43 may be formed of an organic material. The hydrophobicity of the second bank 43 can prevent the hydrophilic organic light-emitting material from piling up at the edge portion closing to the second bank 43. Therefore, the organic light-emitting material is coated on the first electrodes 30 with a relatively uniform thickness. Further, the second bank 43 can serve as a barrier for confining organic light-emitting materials dropped to corresponding regions such that organic light-emitting materials having different colors can be prevented from being mixed.

The second opening OA2 is separated from the outer circumference of the first opening OA1. That is, the boundary of the first bank 41 is a predetermined distance from the boundary of the second bank 43. Accordingly, the first opening OA1 can be exposed through the second opening OA2.

The organic emission layer 50 is positioned on the substrate 10 on which the second bank 43 is formed. The organic emission layer 50 is disposed in the corresponding second opening OA2. Organic light-emitting materials having different colors may be sequentially alternately dropped to corresponding second openings OA2.

The first organic emission layer 50-1 and the second organic emission layer 50-2 are disposed in second openings OA2 allocated to odd columns and odd rows. That is, the first organic emission layer 50-1 emitting light in the first color is formed in the second openings OA2 allocated to the first sub-pixels SP1 and the second organic emission layer 50-2 emitting light in the second color is formed in the second openings OA2 allocated to the second sub-pixels SP2 in odd columns and odd rows. The planar shape of the first organic emission layer 50-1 may correspond to that of the second opening OA2 in which the first organic emission layer 50-1 is formed. The planar shape of the second organic emission layer 50-2 may correspond to that of the second opening OA2 in which the second organic emission layer 50-2 is formed.

The third organic emission layer 50-3 is disposed in the second openings OA2 allocated to even columns and even rows. That is, the third organic emission layer 50-3 emitting light in the third color is formed in a direction in which the second openings OA2 extend to cover the first electrodes 30 of a plurality of third sub-pixels SP3 arranged in the first direction and the second direction in even columns and in even rows. In even columns and even rows, an organic light-emitting material having the third color deposited to one second opening OA2 covers a plurality of first electrodes 30 and the first bank 41 exposed through the second opening OA2 and is not physically separated by the first bank 41. This means that a plurality of third sub-pixels SP3 allocated to a position corresponding to one second opening OA2 emits lights in the same color, that is, the third color. The planar shape of the third organic emission layer 50-3 may correspond to that of the second opening OA2 in which the third organic emission layer 50-3 is formed.

The third organic emission layer 50-3 may be disposed to surround the first organic emission layer 50-1 formed in a certain first sub-pixel SP1 having the second bank 43 positioned therebetween in a plan view. The third organic emission layer 50-3 may be disposed to surround the second organic emission layer 50-2 formed in a certain second sub-pixel SP2 having the second bank 43 positioned therebetween in a plan view.

The second bank 43 is positioned between neighboring second openings OA2 to prevent organic light-emitting materials having different colors deposited to the neighboring second openings OA2 from being mixed. That is, organic light-emitting materials having different colors deposited to different second openings OA2 are physically separated by the second bank 43.

That is, the second bank 43 remains between the first electrodes 30 of the first sub-pixel SP1 and the second sub-pixel SP2 which neighbor in odd columns and odd rows. The first organic emission layer 50-1 and the second organic emission layer 50-2 are physically separated from each other by the second bank 43.

The second bank 43 remains between the first electrodes 30 of the first sub-pixels SP1 disposed in odd columns and the first electrodes 30 of the third sub-pixels SP3 disposed in even columns. The first organic emission layer 50-1 and the third organic emission layer 50-3 are physically separated from each other by the second bank 43. The second bank 43 remains between the first electrodes 30 of the second sub-pixels SP2 disposed in odd columns and the first electrodes 30 of the third sub-pixels SP3 disposed in even columns. The second organic emission layer 50-2 and the third organic emission layer 50-3 are physically separated from each other by the second bank 43.

The second bank 43 remains between the first electrodes 30 of the first sub-pixels SP1 disposed in odd rows and the first electrodes 30 of the third sub-pixels SP3 disposed in even rows. The first organic emission layer 50-1 and the third organic emission layer 50-3 are physically separated from each other by the second bank 43. The second bank 43 remains between the first electrodes 30 of the second sub-pixels SP2 disposed in odd rows and the first electrodes 30 of the third sub-pixels SP3 disposed in even rows. The second organic emission layer 50-2 and the third organic emission layer 50-3 are physically separated from each other by the second bank 43.

An organic light-emitting material used to form the organic emission layer 50 in the solution process is deposited to cover at least parts of the first electrodes 30, parts of the first bank 41 and parts of the second bank 43. The first bank 41 is a hydrophilic thin film provided to prevent poor wettability of the first electrodes 30 due to hydrophobicity thereof and allows hydrophilic organic light-emitting materials to well spread. The second bank 43 is a hydrophobic thick film and can prevent the hydrophilic organic light-emitting material from piling up at the edge portion closing to the second bank 43. Therefore, the organic light-emitting material is coated on the first electrodes 30 with a relatively uniform thickness. The organic emission layer 50 can be formed to a relatively uniform thickness on emission regions according to a combined structure of the first bank 41 and the second bank 43.

Furthermore, when the second openings OA2 respectively expose the first electrodes 30, an organic light-emitting material may be dropped to different thickness to the second openings OA2 due to an equipment deviation in the solution process. The equipment deviation may mean a discharge rate deviation in nozzles of inkjet equipment. That is, nozzles used to deposit an organic light-emitting material to the second openings OA2 may not have a uniform discharge rate. In this case, the organic light-emitting material deposited to sub-pixels SP through nozzles respectively allocated to the sub-pixels SP may have different thicknesses based on location. A thickness deviation is recognized by a user as spot defects and considerably deteriorates display quality.

According to the present disclosure, a plurality of third sub-pixels SP3 can be allocated to one second opening OA2 and a number of nozzles corresponding to the number of third sub-pixels SP3 can be allocated, and thus a discharge rate deviation in nozzles can be compensated and an organic light-emitting material emitting light in the third color deposited to the second openings OA2 can be coated to a uniform thickness.

The second opening OA2 that simultaneously exposes the first electrodes 30 of the third sub-pixels SP3 may further include connecting portions 130 having a relatively narrow width. Each connecting portion 130 may be disposed between neighboring third sub-pixel SP3 in predetermined regions. Alternatively, the connecting portion 130 may be disposed between the first electrodes 30 of neighboring third sub-pixels SP3 in predetermined regions.

For example, the first electrodes 30 of the third sub-pixels SP3 may include (1-1)-th electrodes 30-1 and (1-2)-th electrodes 30-2 simultaneously exposed through a single second opening OA2. Here, the second opening OA2 includes first portions 110 that expose the (1-1)-th electrodes 30-1, second portions 120 that expose the (1-2)-th electrodes 30-2 and the connecting portions 130 that connect the first portions 110 and the second portions 120. The connecting portions 130 have a width less than those of the first and second portions 110 and 120.

The connecting portions 130 having a width less than those of the first and second portions 110 and 120 can be provided to control flow of an organic light-emitting material dropped to the second opening OA2. That is, the present disclosure can allow an organic light-emitting material dropped to the second opening OA2 to flow on a plurality of first electrodes 30 by forming the second opening OA2 that exposes the plurality of first electrodes 30 and limit excessive flow of the organic light-emitting material to a specific region by forming the connecting portions 130.

The present disclosure can minimize concentration of the organic light-emitting material deposited to the second opening OA2 on particles even if the particles remain on a specific third sub-pixel SP3 in the solution process. Accordingly, the present disclosure can effectively prevent luminance non-uniformity due to a thickness deviation in the third organic emission layer 50-3.

The connecting portions 130 can extend between a first sub-pixel SP1 and a second sub-pixel SP2 which neighbor in the first direction in predetermined regions. Alternatively, the connecting portions 130 can extend between first electrodes 30 of a first sub-pixel SP1 and a second sub-pixel SP2 which neighbor in the first direction in predetermined regions. Accordingly, the connecting portions 130 can be disposed in rows in which the first sub-pixels SP1 and the second sub-pixels SP2 are disposed.

Further, the connecting portions 130 can extend between a first sub-pixel SP1 and a second sub-pixel SP2 which neighbor in the second direction in predetermined regions. Alternatively, the connecting portions 130 can extend between first electrodes 30 of a first sub-pixel SP1 and a second sub-pixel SP2 which neighbor in the second direction in predetermined regions. Accordingly, the connecting portions 130 can be disposed in columns in which the first sub-pixels SP1 and the second sub-pixels SP2 are disposed.

In the present disclosure, since the connecting portions 130 having a relatively narrow width are provided, a distance between a first sub-pixel SP1 and a second sub-pixel SP2 which neighbor in the first direction and the second direction having the connecting portions 130 disposed therebetween can be reduced. This means the areas of the first sub-pixels SP1 and the second sub-pixels SP2 can be set to be relatively large because the first sub-pixels SP1 and the second sub-pixels SP2 can be arranged more densely and thus the aperture ratio can be improved.

Those skilled in the art will appreciate that various modifications and variations can be made in the present disclosure without departing from the spirit or scope of the disclosure through the above description. Accordingly, the technical scope of the present disclosure should not be limited to the detailed description of the specification but should be determined by the claims.

What is claimed is:

1. An organic light emitting display device comprising:
    first sub-pixels and second sub-pixels alternately arranged on a substrate in a first direction and a second direction orthogonal to the first direction;
    third sub-pixels arranged in a third direction at tilted angles with the first direction and the second direction with respect to the first sub-pixels and the second sub-pixels;
    first electrodes of an organic light-emitting diodes respectively allocated to each of the first to third sub-pixels;
    a first bank having first openings for exposing the first electrodes, the first bank on the first electrodes;
    a second bank having second openings for exposing the first electrodes, the second bank on the first bank; and
    a second electrode disposed on the second bank and an organic emission layer of the organic light-emitting diodes,
    wherein the first bank has hydrophilicity and the second bank has hydrophobicity,
    wherein the second openings respectively expose the first electrode of the first to third sub-pixels, and each of the second openings which exposes the first electrodes of the third sub-pixels simultaneously exposes the first electrodes of at least two of the third sub-pixels, and
    wherein each of the second openings which exposes the first electrodes of the third sub-pixels further exposes the first bank between the first electrodes of at least two of the third sub-pixels and overlaps with at least two of the first openings.

2. The organic light emitting display device of claim 1, wherein the first and second sub-pixels are arranged in one of an odd column and an even column and the third sub-pixels are arranged in another one of the odd column and the even column, and
    wherein the first and second sub-pixels are arranged in one of an odd row and an even row and the third sub-pixels are arranged in another one of the odd row and the even row.

3. The organic light emitting display device of claim 2, wherein at least one of the second openings simultaneously expose a plurality of the first electrodes disposed in columns in which the third sub-pixels are arranged.

4. The organic light emitting display device of claim 2, wherein at least one of the second openings simultaneously expose a plurality of the first electrodes disposed in rows in which the third sub-pixels are arranged.

5. The organic light emitting display device of claim 2, wherein at least one of the second openings simultaneously expose a plurality of the first electrodes disposed in columns and rows in which the third sub-pixels are arranged.

6. The organic light emitting display device of claim 1, wherein the first openings respectively expose the first electrodes of the first to third sub-pixels, and
wherein a number of first openings differs from a number of second openings in columns in which the third sub-pixels are arranged or a number of first openings differs from a number of second openings in rows in which the third sub-pixels are arranged.

7. The organic light emitting display device of claim 1, wherein the first electrodes of the third sub-pixels include (1-1)-th electrodes and (1-2)-th electrodes simultaneously exposed through the second openings,
the second openings include first portions for exposing the (1-1)-th electrodes, second portions for exposing the (1-2)-th electrodes, and connecting portions for connecting the first portions and the second portions, and
the connecting portions have a width less than widths of the first and second portions.

8. The organic light emitting display device of claim 7, wherein the connecting portions extend between a first sub-pixel and a second sub-pixel neighboring in the first direction.

9. The organic light emitting display device of claim 7, wherein the connecting portions extend between a first sub-pixel and a second sub-pixel neighboring in the second direction.

10. The organic light emitting display device of claim 7, wherein the connecting portions are disposed in at least one of a column and a row in which the first and second sub-pixels are arranged.

11. The organic light emitting display device of claim 1, further comprising:
a first organic emission layer disposed in second openings for exposing the first electrodes of the first sub-pixels;
a second organic emission layer disposed in second openings for exposing the first electrodes of the second sub-pixels; and
a third organic emission layer disposed in second openings for exposing the first electrodes of the third sub-pixels;
wherein the third organic emission layer is disposed to surround the first organic emission layer having the second bank positioned between the third and first organic emission layers or disposed to surround the second organic emission layer having the second bank positioned between the third and second organic emission layer.

12. The organic light emitting display device of claim 1, wherein the third sub-pixels are green sub-pixels.

13. The organic light-emitting display device of claim 1, further comprises a transistor configured for each of the first sub-pixels, the second sub-pixels and the third sub-pixel,
wherein a gate electrode of the transistor is electrically connected to the first electrode.

14. The organic light-emitting display device of claim 1, wherein the second electrode of the organic light-emitting diodes has a bend portion at an edge of each of the sub-pixels.

* * * * *